US012690399B2

(12) United States Patent
Blanquart et al.

(10) Patent No.: US 12,690,399 B2
(45) Date of Patent: Jul. 21, 2026

(54) METHODS AND SYSTEMS FOR FILLING A GAP

(71) Applicant: ASM IP Holding B.V., Almere (NL)

(72) Inventors: Timothee Blanquart, Oud-Heverlee (BE); René Henricus Jozef Vervuurt, Leuven (BE); Giuseppe Alessio Verni, Jodoigne (BE); Ren-Jie Chang, Leuven (BE); Charles Dezelah, Helsinki (FI); Qi Xie, Wilsele (BE); Viljami Pore, Helsinki (FI)

(73) Assignee: ASM IP Holding B.V., Almere (NL)

( * ) Notice: Subject to any disclaimer, the term of this patent is extended or adjusted under 35 U.S.C. 154(b) by 781 days.

(21) Appl. No.: 17/953,803

(22) Filed: Sep. 27, 2022

(65) Prior Publication Data

US 2023/0095086 A1 Mar. 30, 2023

Related U.S. Application Data

(60) Provisional application No. 63/261,884, filed on Sep. 30, 2021.

(51) Int. Cl.
H10P 14/43 (2026.01)

(52) U.S. Cl.
CPC .................................... H10P 14/43 (2026.01)

(58) Field of Classification Search
CPC ......... H01L 21/28556; H01L 21/76877; H01L 21/32055; H01L 21/0223; H01L 21/02175; H01L 21/02247; H01L 21/76837; C23C 16/045; C23C 16/40; C23C 16/452; C23C 16/45536; C23C 16/50; C23C 16/06; C23C 16/56; H10P 14/43; H10P 14/416; H10P 14/6939; H10P 14/6316; H10P 14/6304; H10W 20/056; H10W 20/098
See application file for complete search history.

(56) References Cited

U.S. PATENT DOCUMENTS

| | | | | |
|---|---|---|---|---|
| 5,851,581 | A * | 12/1998 | Zenke ............... | H01L 21/76876 |
| | | | | 427/124 |
| 7,316,962 | B2 * | 1/2008 | Govindarajan ........ | H10D 1/684 |
| | | | | 257/E21.01 |
| 8,124,531 | B2 * | 2/2012 | Chandrashekar ........................... | |
| | | | | H01L 21/76865 |
| | | | | 257/E21.586 |
| 2015/0252474 | A1 * | 9/2015 | Itatani ............... | C23C 16/45551 |
| | | | | 438/758 |
| 2017/0148670 | A1 * | 5/2017 | Lei ........................... | C23C 16/46 |
| 2017/0221759 | A1 * | 8/2017 | Xu ..................... | H01L 21/76877 |
| 2018/0158688 | A1 * | 6/2018 | Chen ................. | H01L 21/28556 |

* cited by examiner

*Primary Examiner* — Dale E Page
*Assistant Examiner* — Quovaunda Jefferson
(74) *Attorney, Agent, or Firm* — Snell & Wilmer L.L.P.

(57) ABSTRACT

Disclosed are methods and systems for filling a gap. An exemplary method comprises providing a substrate to a reaction chamber. The substrate comprises the gap. The method further comprises forming a gap filling process by means of a plasma-enhanced deposition process. The gap filling fluid at least partially fills the gap. The methods and systems are useful, for example, in the field of integrated circuit manufacture.

15 Claims, 14 Drawing Sheets

500

520

510

511

512

METHODS AND SYSTEMS FOR FILLING A GAP

CROSS-REFERENCE TO RELATED APPLICATIONS

This application claims priority to U.S. Provisional Patent Application Ser. No. 63/261,884, filed Sep. 30, 2021, and titled METHODS AND SYSTEMS FOR FILLING A GAP, the disclosure of which is hereby incorporated by reference in its entirety.

FIELD OF INVENTION

The present disclosure generally relates to the field of semiconductor processing methods and systems, and to the field integrated circuit manufacture. In particular, methods and systems suitable for filling a gap are disclosed.

BACKGROUND OF THE DISCLOSURE

The scaling of semiconductor devices, such as, for example, logic devices and memory devices, has led to significant improvements in speed and density of integrated circuits. However, conventional device scaling techniques face significant challenges for future technology nodes.

For example, one challenge has been finding suitable ways of filling gaps such as recesses, trenches, vias and the like with a material without formation of any gaps or voids.

Any discussion, including discussion of problems and solutions, set forth in this section has been included in this disclosure solely for the purpose of providing a context for the present disclosure. Such discussion should not be taken as an admission that any or all of the information was known at the time the invention was made or otherwise constitutes prior art.

SUMMARY OF THE DISCLOSURE

This summary may introduce a selection of concepts in a simplified form, which may be described in further detail below. This summary is not intended to necessarily identify key features or essential features of the claimed subject matter, nor is it intended to be used to limit the scope of the claimed subject matter.

Various embodiments of the present disclosure relate to methods of filling a gap, to structures and devices formed using such methods, and to apparatus for performing the methods and/or for forming the structures and/or devices. Materials formed by way of the presently disclosed methods may be used in a variety of applications. For example, they may be used in the field of integrated circuit manufacture.

Thus described herein is a method of filling a gap. The method comprises providing a substrate to a reaction chamber. The substrate comprises the gap. The method further comprises providing a precursor to the reaction chamber. The method further comprises the reactant to the reaction chamber. The method further comprises generating a plasma in the reaction chamber during at least one of providing the precursor to the reaction chamber and providing the reactant to the reaction chamber. The method further comprises at least one of the precursor and the reactant comprising a metal or a metalloid, and at least one of the precursor and the reactant comprising a halogen. Thus, the precursor and the reactant are allowed to form a gap filling fluid. Thus, the gap is at least partially filled with the gap filling fluid. The gap filling fluid comprises the metal or metalloid.

In some embodiments, the method comprises continuously providing the precursor and the reactant to the reaction chamber.

In some embodiments, the plasma is continuously generated in the reaction chamber, the reactant is continuously provided to the reaction chamber, and the precursor is provided to the reaction chamber in a plurality of precursor pulses.

Further described herein is a method of filling a gap. The method comprises providing a substrate to a reaction chamber. The substrate comprises the gap. The method further comprises providing a precursor to the reaction chamber. The method further comprises providing a reactant to at least one of a plasma generation space and a remote plasma source, wherein the plasma generation space comprised in the reaction chamber, wherein the plasma generation space is separated from the substrate by means of a barrier, and wherein the remote plasma source is located outside of the reaction chamber. Suitable barriers include perforated plates, and mesh plates. The method further comprises generating a plasma in at least one of the plasma generation space and the remote plasma source while providing the reactant to at least one of the plasma generation space and the remote plasma source. It shall be understood that the precursor comprises a metal or a metalloid, and at least one of the precursor and the reactant comprises a halogen. Thus, the precursor and active species are generated in at least one of the plasma generation space and the remote plasma source to form a gap filling fluid. Thus, the gap is at least partially filled with the gap filling fluid. The gap filling fluid comprises the metal or the metalloid.

In some embodiments, a method as disclosed herein comprises continuously providing the precursor to the reaction chamber. The method further comprises providing the reactant to at least one of the plasma generation space and the remote plasma source.

In some embodiments, the plasma is continuously generated in at least one of the plasma generation space and the remote plasma source. The reactant is continuously provided to at least one of the plasma generation space and the remote plasma source. The precursor is provided to the reaction chamber in a plurality of precursor pulses.

In some embodiments, exposing the substrate to a precursor and to a reactant comprises one or more deposition cycles. A deposition cycle comprises a precursor pulse and a reactant pulse. The precursor pulse comprises providing precursor to the reaction chamber. The reactant pulse comprises providing reactant to the reaction chamber.

In some embodiments, providing a precursor to the reaction chamber, and providing a reactant to at least one of a plasma generation space and a remote plasma source comprises one or more deposition cycles. A deposition cycle comprises a precursor pulse and a reactant pulse. The precursor pulse comprises providing precursor to the reaction chamber. The reactant pulse comprises providing the reactant to at least one of the plasma generation space and the remote plasma source.

In some embodiments, a conformal liner is simultaneously formed in the gap while the gap filling fluid is formed.

In some embodiments, the precursor comprises a metal halide, and the reactant comprises at least one of a noble gas and $H_2$.

In some embodiments, the precursor comprises a metal halide, and the reactant comprises an oxygen reactant.

In some embodiments, a deposition cycle further comprises a nitrogen reactant pulse. The nitrogen reactant pulse comprises providing a nitrogen reactant to at least one of the reaction chamber, the plasma generation space, and the remote plasma source.

In some embodiments, a deposition cycle comprises sequentially executing a plurality of subsequent precursor pulses and nitrogen reactant pulses before or after executing a reactant pulse.

In some embodiments, the nitrogen reactant is continuously provided to at least one of the reaction chamber, the plasma generation space, and the remote plasma source.

In some embodiments, a method as described herein further comprises a step of exposing the substrate to a transformation treatment.

In some embodiments, a method as described herein comprises a plurality of super cycles. A super cycle comprises the step of providing a precursor, the step of providing a reactant, and the step of exposing the substrate to the transformation treatment.

In some embodiments, the transformation treatment comprises generating a plasma.

In some embodiments, the transformation treatment comprises exposing the substrate to at least one of radicals and ions.

In some embodiments, the transformation treatment comprises exposing the substrate to a thermal anneal.

In some embodiments, the thermal anneal comprises at least one of exposing the substrate to an oxidizing agent, a nitridation agent, a reducing agent, and an inert gas.

In some embodiments, the transformation treatment comprises exposing the substrate to ultraviolet radiation.

In some embodiments, exposing the substrate to ultraviolet radiation occurs while exposing the substrate to at least one of an oxidizing agent, a nitridation agent, a reducing agent, and a noble gas.

In some embodiments, the gap filling fluid further comprises the halogen.

In some embodiments, the metal or metalloid comprises an element selected from W, Ge, Sb, Te, Nb, Ta, V, Hf, Ti, Zr, Rh, Fe, Cr, Mo, Au, Pt, Ag, Ni, Cu, Co, Zn, Al, In, Sn, and Bi.

In some embodiments, the reactant comprises a substance that comprises a X—X bond or a H—X bond; wherein X is a halogen.

Further described herein is a system. The system comprises a reaction chamber. The system further comprises a precursor gas source that comprises a metal precursor. The system further comprises a deposition reactant gas source comprising a deposition reactant. The system further comprises a controller. The controller is configured to control gas flow into the reaction chamber to form a layer on a substrate by means of a method as described herein.

Further described herein is a method of filling a gap. The method comprises providing a substrate. The substrate comprises the gap. The method further comprises providing a system comprising a reaction chamber and a remote plasma source. The method further comprises providing a precursor to the reaction chamber. The method further comprises providing a reactant to the remote plasma source. The method further comprises generating a plasma in the remote plasma source. Thus, a plasma species is created in the remote plasma source. A plasma species can alternatively be named an active species, and can include at least one of ions and radicals. The method further comprises transporting the plasma species from the remote plasma source to the chamber. The precursor comprises a metal or a metalloid, and at least one of the precursor and the reactant comprise a halogen. Thus, the precursor and the reactant are allowed to form a gap filling fluid. Also, the gap is then at least partially filled with the gap filling fluid. The gap filling fluid comprises the metal or the metalloid.

In some embodiments, the method comprises simultaneously exposing the substrate to the precursor and the plasma species.

Further described herein is a method of filling a gap. The method comprises providing a substrate. The substrate comprises the gap. The method further comprises providing a system. The system comprises a first reaction chamber and a second reaction chamber. The method further comprises providing a precursor to the first reaction chamber. The method further comprises providing a reactant to the second reaction chamber. The method further comprises generating a plasma in at least one of the first reaction chamber and the second reaction chamber. The method further comprises executing a plurality of deposition cycles. A deposition cycle comprises moving the substrate to the first reaction chamber. A deposition cycle further comprises moving the substrate to the second reaction chamber. It shall be understood that at least one of the precursor and the reactant comprise a metal or a metalloid, and at least one of the precursor and the reactant comprise a halogen. Thus, the precursor and the reactant are allowed to form a gap filling fluid. Thus, the gap is at least partially filled with the gap filling fluid. The gap filling fluid comprises the metal or metalloid.

Further described herein is a method of filling a gap. The method comprises providing a substrate. The substrate comprises the gap. The method further comprises providing a system. The system comprises a first reaction chamber, a second reaction chamber, and a remote plasma source. The method further comprises providing a precursor to the first reaction chamber. The method further comprises providing a reactant to the remote plasma source. The method further comprises generating a plasma in the remote plasma source. Thus, a plasma species is created in the remote plasma source. The method further comprises transporting the plasma species from the remote plasma source to the second reaction chamber. The method further comprises executing a plurality of deposition cycles. A deposition cycle comprises moving the substrate to the first reaction chamber; and moving the substrate to the second reaction chamber. The precursor comprises a metal or a metalloid, and at least one of the precursor and the reactant comprises a halogen. Thus, the precursor and the reactant are allowed to form a gap filling fluid. Also, the gap is at least partially filled with the gap filling fluid. The gap filling fluid comprises the metal or metalloid.

These and other embodiments will become readily apparent to those skilled in the art from the following detailed description of certain embodiments having reference to the attached figures. The invention is not limited to any particular embodiments disclosed.

BRIEF DESCRIPTION OF THE DRAWING FIGURES

A more complete understanding of the embodiments of the present disclosure may be derived by referring to the detailed description and claims when considered in connection with the following illustrative figures.

Figure 1:
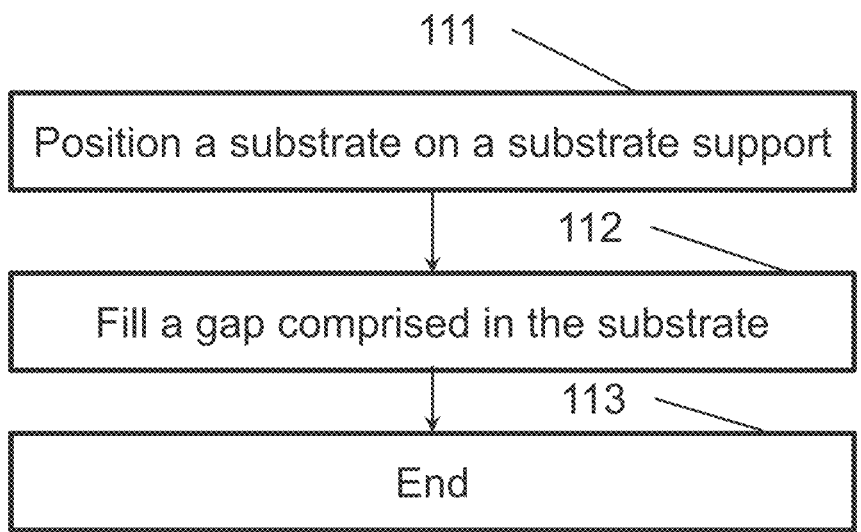
FIG. 1 illustrates an embodiment of a method as disclosed herein.

It will be appreciated that elements in the figures are illustrated for simplicity and clarity and have not necessarily been drawn to scale. For example, the dimensions of some of the elements in the figures may be exaggerated relative to other elements to help improve understanding of illustrated embodiments of the present disclosure.

DETAILED DESCRIPTION OF EXEMPLARY EMBODIMENTS

The description of exemplary embodiments of methods, structures, devices and systems provided below is merely exemplary and is intended for purposes of illustration only; the following description is not intended to limit the scope of the disclosure or the claims. Moreover, recitation of multiple embodiments having stated features is not intended to exclude other embodiments having additional features or other embodiments incorporating different combinations of the stated features. For example, various embodiments are set forth as exemplary embodiments and may be recited in the dependent claims. Unless otherwise noted, the exemplary embodiments or components thereof may be combined or may be applied separate from each other.

In this disclosure, "gas" can include material that is a gas at normal temperature and pressure (NTP), a vaporized solid and/or a vaporized liquid, and can be constituted by a single gas or a mixture of gases, depending on the context. A gas other than the process gas, i.e., a gas introduced without passing through a gas distribution assembly, other gas distribution device, or the like, can be used for, e.g., sealing the reaction space, and can include a seal gas, such as a rare gas. In some cases, the term "precursor" can refer to a compound that participates in the chemical reaction that produces another compound, and particularly to a compound that constitutes a film matrix or a main skeleton of a film; the term "reactant" can be used interchangeably with the term precursor.

As used herein, the term "substrate" can refer to any underlying material or materials that can be used to form, or upon which, a device, a circuit, or a film can be formed. A substrate can include a bulk material, such as silicon (e.g., single-crystal silicon), other Group IV materials, such as germanium, or other semiconductor materials, such as Group II-VI or Group III-V semiconductor materials, and can include one or more layers overlying or underlying the bulk material. Further, the substrate can include various features, such as recesses, protrusions, and the like formed within or on at least a portion of a layer of the substrate. By way of examples, a substrate can include at least one of bulk semiconductor material and an insulating or dielectric material layer overlying at least a portion of the bulk semiconductor material.

The term "deposition process" as used herein can refer to the introduction of precursors (and/or reactants) into a reaction chamber to deposit a layer over a substrate. "Cyclical deposition processes" are examples of "deposition processes".

As used herein, the term "gap filling fluid", also referred to as "flowable gap fill", may refer to a composition of matter that is liquid, or that can form a liquid, under the conditions under which is formed and which has the capability to form a solid film. A gap filling fluid can be in a flowable state permanently, or at least temporarily, i.e. for a pre-determined amount of time before the gap filling fluid solidifies. For example, a polymerizable precursor may start undergoing polymerization in a gaseous state, and it may form oligomeric species. The oligomeric species can condense to form a flowable phase while still continuing to undergo polymerization.

A method as described herein can comprise forming a material such as a gap filling fluid by means of a cyclic deposition process. The term "cyclic deposition process" or "cyclical deposition process" can refer to a sequential introduction of precursors (and/or reactants) into a reaction chamber to deposit a layer over a substrate. A cyclical deposition process can include cyclically providing a precursor, providing a reactant, and generating a plasma in a reaction chamber. Additionally or alternatively, a cyclical deposition process can include cyclically exposing a substrate to active species generated in a remote plasma.

As used herein, the term "purge" may refer to a procedure in which at least one of flow of a precursor, flow of a reactant, and exposure of a substrate to active species, is temporarily stopped. Suitably, active species can be generated by means of a plasma. A purge can occur between two pulses. A pulse can comprise executing a process step such as exposing a substrate to one or more of precursor, providing reactant, and plasma, for a pre-determined amount of time. A purge then comprises temporarily stopping exposure of the substrate to one or more of precursor, reactant, and plasma. It shall be understood that a purge can be effected either in time or in space, or both. For example in the case of temporal purges, a purge step can be used e.g. in the temporal sequence of providing a first precursor to a reaction chamber, providing a purge gas to the reaction chamber, and providing a second precursor to the reaction chamber, wherein the substrate on which a layer is deposited does not move. For example in the case of spatial purges, a purge step can take the following form: moving a substrate from a first location to which a first precursor is continually supplied, through a purge gas curtain, to a second location to which a second precursor is continually supplied.

As used herein, a "precursor" includes a gas or a material that can become gaseous and that can be represented by a chemical formula that includes an element that may be incorporated during a deposition process as described herein.

The term "oxygen reactant" can refer to a gas or a material that can become gaseous and that can be represented by a chemical formula that includes oxygen. In some cases, the chemical formula includes oxygen and hydrogen.

The term "nitrogen reactant" can refer to a gas or a material that can become gaseous and that can be represented by a chemical formula that includes nitrogen. In some cases, the chemical formula includes nitrogen and hydrogen.

Further, in this disclosure, any two numbers of a variable can constitute a workable range of the variable, and any ranges indicated may include or exclude the endpoints. Additionally, any values of variables indicated may refer to precise values or approximate values and include equivalents, and may refer to average, median, representative, majority, or the like. Further, in this disclosure, the terms "including," "constituted by" and "having" refer independently to "typically or broadly comprising," "comprising," "consisting essentially of," or "consisting of" in some embodiments.

It shall be understood that a distal portion of a gap refers to a portion of the gap feature that is relatively far removed from a substrate's surface, and that the proximal portion of a gap feature refers to a part of the gap feature that is closer to the substrate's surface compared to the lower/deeper portion of the gap feature.

In this disclosure, any defined meanings do not necessarily exclude ordinary and customary meanings, in some embodiments.

In one aspect, described herein is a method for filling a gap. The gap is comprised in a substrate. The method comprises providing the substrate to a reaction chamber. The method further comprises providing a precursor and a reactant to the reaction chamber. The method further comprises generating a plasma in the reaction chamber during at least one of providing the precursor to the reaction chamber and providing the reactant to the reaction chamber. At least one of the precursor and the reactant comprises a metal or a metalloid. In addition, at least one of the precursor and the reactant comprises a halogen. The precursor and the reactant are allowed to form a gap filling fluid. Thus, the gap is partially or wholly filled with the gap filling fluid.

In a further aspect, a method as described herein can additionally or alternatively be thought of in the following terms, that is, as a method of filling a gap. The method comprises providing a substrate. The substrate comprises a gap. The method further comprises providing a precursor to the reaction chamber. The method further comprises providing a reactant to the reaction chamber. The method further comprises generating a plasma in the reaction chamber during at least one of providing the precursor to the reaction chamber and providing the reactant to the reaction chamber. At least one of the precursor and the reactant comprises a metal or a metalloid. At least one of the precursor and the reactant comprises a halogen. Thus, the precursor and the reactant are allowed to form a gap filling fluid. Thus the gap is at least partially filled with the gap filling fluid. The gap filling fluid comprises the metal or metalloid.

In a further aspect, a method as described herein comprises providing a substrate to a reaction chamber. The substrate comprises the gap. The method further comprises providing a precursor to the reaction chamber. The method further comprises providing a reactant to at least one of a plasma generation space and a remote plasma source. The plasma generation space is comprised in the reaction chamber. The plasma generation space is separated from the substrate by means of a barrier such as a perforated plate or a mesh plate. The remote plasma source is located outside of the reaction chamber. The reactant is provided to at least one of the plasma generation space and the remote plasma source while a plasma is generated in the plasma generation space, in the remote plasma source, or both. The precursor comprises a metal or a metalloid. In some embodiments, the precursor comprises a halogen. In some embodiments, the reactant comprises a halogen. In some embodiments, the precursor and the reactant comprises a halogen. Thus, active species are generated in the plasma generation space, in the remote plasma unit, or both, and they are allowed to react with the precursor to form the gap filling fluid. As a result, the gap is at least partially filled with the gap filling fluid. The gap filling fluid comprises the metal or the metalloid.

It shall be understood that the gap filling fluid comprises the metal or metalloid. In some embodiments, the gap filling fluid further comprises the halogen. Alternatively, and in some embodiments, the gap filling fluid does not comprise the halogen.

Of course, and in some embodiments, precursor or reactant can comprise more than one metal or metalloid. Thus, in some embodiments, the precursor comprises two or more metals. Additionally or alternatively, the precursor can comprise two or more metalloids. Or, the precursor can comprise at least one metal and at least one metalloid. In some embodiments, the reactant comprises two or more metals. Additionally or alternatively, the reactant can comprise two or more metalloids. Or, the reactant can comprise at least one metal and at least one metalloid.

In some embodiments, the gap filling fluid comprises a compound in a liquid phase that undergoes a gelification process.

In some embodiments, the gap filling fluid comprises oligomers that undergo chain growth as gaseous precursor polymerizes. Accordingly, a flowable oligomer-containing gap filling fluid can, in some embodiments, be temporarily formed on the substrate's surface that solidifies as the oligomers undergo chain growth. Thus, a flowable gap filling fluid can be obtained even at temperatures that are lower than the bulk melting point of a converted layer that is formed by means of a method as disclosed herein.

Of course, the presently described methods can also be used at conversion temperatures which exceed the bulk melting point of gap filling fluids formed by means of the presently described methods.

In some embodiments, a gap filling fluid can be formed even at process conditions at which a bulk gap filling fluid would be normally not be expected to exist in a liquid state, e.g. at temperatures above the bulk gap filling fluid's dew point, or at pressures below the bulk gap filling fluid's critical pressure. In such cases, a gap filling fluid can be formed in gaps through surface tension and capillary effects that locally lower the vapor pressure at which liquid and gas are in equilibrium. In such cases, the gap filling fluid can, in some embodiments, be solidified by cooling the substrate down.

A gap filling fluid can be formed over the entire substrate surface, both outside gaps and inside gaps comprised in the substrate. When the gap filling fluid is formed both outside of the gaps and inside the gaps, the gap filling fluid can, in some exemplary modes of operation, be drawn into a gap by at least one of capillary forces, surface tension, and gravity.

The materials formed according to the present methods can be advantageously used in the field of integrated circuit manufacture.

Exemplary gaps include recesses, contact holes, vias, trenches, and the like. In some embodiments, the gap has a depth of at least 5 nm to at most 500 nm, or of at least 10 nm to at most 250 nm, or from at least 20 nm to at most 200 nm, or from at least 50 nm to at most 150 nm, or from at least 100 nm to at most 150 nm.

In some embodiments, the gap has a width of at least 10 nm to at most 10 000 nm, or of at least 20 nm to at most 5 000 nm, or from at least 40 nm to at most 2 500 nm, or from at least 80 nm to at most 1000 nm, or from at least 100 nm to at most 500 nm, or from at least 150 nm to at most 400 nm, or from at least 200 nm to at most 300 nm.

In some embodiments, the gap has a length of at least 10 nm to at most 10 000 nm, or of at least 20 nm to at most 5 000 nm, or from at least 40 nm to at most 2 500 nm, or from at least 80 nm to at most 1000 nm, or from at least 100 nm to at most 500 nm, or from at least 150 nm to at most 400 nm, or from at least 200 nm to at most 300 nm.

In some embodiments, the precursor comprises an element that is selected from W, Ge, Sb, Te, Nb, Ta, V, Ti, Zr, Hf, Rh, Fe, Cr, Mo, Au, Pt, Ag, Ni, Cu, Co, Zn, Al, In, Sn, and Bi. Of course, and in some embodiments, the precursor can comprise more than one metals, more than one metalloid, or at least one metal and at least one metalloid, in some embodiments.

In some embodiments, the precursor comprises a ligand that in turn comprises an alkyl-substituted benzene ring. Examples of such precursors include precursors comprising a metal center and one or more methylbenzene ligands, ethylbenzene ligands, or propylbenzene ligands. In some embodiments, the precursor comprises a metal halide, for example a metal fluoride, a metal chloride, a metal bromide, or a metal iodide. An exemplary metal halide is vanadium tetrachloride.

In some embodiments, the precursor comprises an alkyl ligand, such as C1 to C4 alkyl, such as methyl, ethyl, propyl, or butyl.

In some embodiments, the precursor comprises an alkylamine ligand, such as an alkylamine ligand comprising at least one C1 to C4 alkyl.

In some embodiments, the precursor comprises an alkoxy ligand, such as a methoxy, ethoxy, or propoxy ligand.

In some embodiments, the reactant comprises a X—X bond or a H—X bond or a C—X bond; with X a halogen.

In some embodiments, the reactant comprises at least one of an elemental halogen, a hydrogen halide, and a haloalkane. Suitable elemental halogens include $F_2$, $Cl_2$, $Br_2$, and $I_2$. Suitable hydrogen halides include HF, HCl, HBr, and HI. Suitable haloalkanes have a general formula of which have the general formula "RX" wherein R is a substituted or unsubstituted alkyl group and X is a halogen (F, Cl, Br, I). Suitable haloalkanes include $CF_4$, $CH_3Br$.

When the precursor comprises a halogen, the reactant does not necessarily comprise a halogen. Suitable reactants that do not comprise a halogen include oxygen reactants and nitrogen reactants. Suitable oxygen reactants include $O_2$, $O_3$, and $H_2O$. Suitable nitrogen reactants include N2, $NH_3$ and gas mixtures comprising $N_2$ and $H_2$.

In some embodiments, a method as described herein comprises simultaneously exposing the substrate to the precursor and the reactant. In some embodiments, the substrate is simultaneously exposed to precursor, reactant, and a direct plasma. In some embodiments, the substrate is simultaneously exposed to precursor, reactant, and an indirect plasma. In some embodiments, the substrate is simultaneously exposed to precursor, reactant, and an active species, e.g. radicals, generated in a remote plasma source.

In some embodiments, a method as described herein comprises continuously providing the precursor and the reactant to the reaction chamber.

In some embodiments, a method as described herein comprises continuously providing the precursor to the reaction chamber, and continuously providing the reactant to at least one of the plasma generation space and the remote plasma source.

In some embodiments, exposing the substrate to a precursor and to a reactant comprises one or more deposition cycles. A deposition cycle comprises a precursor pulse and a reactant pulse. The precursor pulse comprises exposing the substrate to the precursor. The reactant pulse comprises exposing the substrate to the reactant. In other words, and in some embodiments, exposing the substrate to a precursor and to a reactant can comprise alternatingly exposing the substrate to precursor and to the reactant.

In some embodiments, providing a precursor to the reaction chamber, and providing a reactant to at least one of a plasma generation space and a remote plasma source comprises one or more deposition cycles. A deposition cycle comprises a precursor pulse and a reactant pulse. The precursor pulse comprises providing precursor to the reaction chamber. The reactant pulse comprises providing the reactant to at least one of the plasma generation space and the remote plasma source.

A plasma may be generated continuously, or a plasma may be generated intermittently, i.e. in pulses. Thus, in some embodiments, a plasma is continuously generated in the reaction chamber, the reactant is continuously provided to the reaction chamber, and the precursor is provided to the reaction chamber in a plurality of precursor pulses. Alternatively, and in some embodiments, a plasma is generated in the reaction chamber intermittently, i.e. in pulses, the reactant is provided continuously in the reaction chamber, and the precursor is continuously provided to the reaction chamber. In some embodiments, the plasma is continuously generated in the reaction chamber, the reactant is continuously provided to the reaction chamber, and the precursor is provided to the reaction chamber in a plurality of precursor pulses.

In some embodiments, the plasma is continuously generated in at least one of a plasma generation space and a remote plasma source. In some embodiments, the reactant is continuously provided to at least one of the plasma generation space and the remote plasma source, and the precursor is provided to the reaction chamber in a plurality of precursor pulses.

In some embodiments, a deposition cycle comprises a precursor pulse, a reactant pulse, and a plasma pulse. The precursor pulse comprises exposing the substrate to the precursor. The reactant pulse comprises exposing the substrate to the reactant. The plasma pulse comprises generating a plasma. Suitably, the plasma can be generated in the reaction chamber. In some embodiments, the plasma pulse occurs together with at least one of the precursor pulse and the reactant pulse. Alternatively, a plasma pulse can be separated from the precursor pulse and the reactant pulse by a purge.

It shall be understood that such pulsing schemes can be used with any one of direct plasma configurations, indirect plasma configurations, and remote plasma configurations, as described herein.

In some embodiments, the precursor comprises a metal halide, and the reactant comprises at least one of a noble gas and $H_2$.

In some embodiments, the precursor comprises a metal halide and a deposition cycle comprises providing a plasma gas to the reaction chamber and exposing the substrate to a direct plasma. The plasma gas can suitably comprise a noble gas.

In some embodiments, the precursor comprises a metal halide and a deposition cycle comprises providing a plasma gas to the reaction chamber and exposing the substrate to a direct plasma. The plasma gas can suitably comprise a noble gas and $H_2$.

In some embodiments, the precursor comprises a metal halide and a deposition cycle comprises providing a plasma gas to a plasma generation space. In such embodiments, a deposition cycle can further comprise exposing the substrate to active species generated in the plasma generation space of an indirect plasma system as described herein. In such embodiments, the plasma gas can suitably comprise a noble gas.

In some embodiments, the precursor comprises a metal halide and a deposition cycle comprises providing a plasma gas to a remote plasma source. In such embodiments, a deposition cycle can further comprise exposing the substrate to active species generated in the remote plasma source. In such embodiments, the plasma gas can suitably comprise a noble gas.

In some embodiments, the precursor comprises a metal halide and a deposition cycle comprises providing a plasma gas to a plasma generation space. In such embodiments, a deposition cycle can further comprise exposing the substrate to active species generated in the plasma generation space of an indirect plasma system as described herein. In such embodiments, the plasma gas can suitably comprise a noble gas and $H_2$.

In some embodiments, the precursor comprises a metal halide and a deposition cycle comprises providing a plasma gas to a remote plasma source. In such embodiments, a deposition cycle can further comprise exposing the substrate to active species generated in the remote plasma source. In such embodiments, the plasma gas can suitably comprise a noble gas and $H_2$.

In some embodiments, the precursor comprises an alkylamine, and the reactant comprise comprises active species generated in a remote plasma source. The remote plasma can employ a plasma gas comprising nitrogen, fluorine, and a noble gas. An exemplary plasma gas comprises a mixture of $NF_3$ and Ar. An exemplary precursor comprises a dimethylamine ligand. For example, a gap filling fluid comprising $TiF_4$ can be obtained using tetrakis (dimethylamino)titanium. Other metal centers that can be suitably employed with alkylamine ligands such as dimethylamine ligands include Mo and Hf.

In some embodiments, the precursor comprises a metal halide, and the reactant comprises an oxygen reactant. The metal halide can, for example, comprise one or more of a metal fluoride, a metal chloride, a metal bromide, and a metal iodide. In some embodiments, the metal halide comprises vanadium. In some embodiments, the metal halide comprises $VCl_4$. The oxygen reactant can, for example, be selected from $H_2O$, $O_2$, $O_3$, $H_2O_2$, and gas mixtures comprising $H_2$ and $O_2$.

In some embodiments, a deposition cycle further comprises a nitrogen reactant pulse. The nitrogen reactant pulse comprises exposing the substrate to the nitrogen reactant. Suitable nitrogen reactants include $N_2$, $NH_3$, and gas mixtures comprising $N_2$ and $H_2$. In some embodiments, the precursor comprises $VCl_4$, the reactant comprises $H_2O$, and the nitrogen reactant comprises $NH_3$.

In some embodiments, a deposition cycle can comprise a precursor pulse, an oxygen reactant pulse, and a nitrogen reactant pulse, in any order. In some embodiments, a deposition cycle comprises sequentially executing a plurality of subsequent precursor pulses and nitrogen reactant pulses before or after executing a reactant pulse.

In some embodiments, a deposition cycle comprises a precursor pulse, a reactant pulse, and a nitrogen reactant pulse, in any order. Suitably, the nitrogen reactant pulse comprises providing a nitrogen reactant to at least one of the reaction chamber, the plasma generation space, and the remote plasma source.

In some embodiments, the nitrogen reactant is continuously provided to the reaction chamber, while precursor supply and oxygen reactant supply occur in a pulsed manner. Such a process configuration can advantageously increase throughput.

In some embodiments, the nitrogen reactant is continuously provided to at least one of the reaction chamber, the plasma generation space, and the remote plasma source.

In some embodiments, the precursor and the reactant simultaneously form a liner and a gap filling fluid. In other words, and in some embodiments, while precursor and the reactant are allowed to form a gap filling fluid, the precursor and the reactant simultaneously react to form a conformal liner in the gap.

It shall be understood that the term "conformal liner" can refer to a layer that has a substantially constant thickness across a wafer's surface, irrespective of whether the liner is formed on a planar surface or in a recess or gap. For example, a conformal liner can have a thickness which is uniform within a margin of error of e.g. 50%, or 20%, or 10%, or 5%. This notwithstanding, a conformal liner can, in some embodiments, have a thickness which is higher at a distal end of a gap compared to a substrate surface outside of the gap, for example by at least 1% to at most 5%, or by at least 5% to at most 10%, or by at least 10% to at most 20%, or by at least 20% to at most 50%, or by at least 1% to at most 50%. Conformal liners which exhibit a higher growth rate at a distal end of a gap compared to a substrate surface outside of the gap can be suitably employed for filling gaps.

In some embodiments, the conformal liner can have a thickness which is constant over the surface of the substrate, including in gaps, recesses, and the like, e.g. within a margin of error of 50%, 20%, 10%, 5%, 2%, 1%, 0.5%, or 0.1%.

In some embodiments, a method as described herein further comprises a step of exposing the substrate to a transformation treatment.

A transformation treatment may be carried out after all gap filling fluid has been formed, or gap filling fluid formation steps and transformation treatments can be carried out multiple times in an alternating fashion. Thus, in some embodiments, a method as described herein comprises a plurality of super cycles. A super cycle comprises a step of exposing the substrate to a precursor and to a reactant, i.e. a step of forming a gap filling fluid, and the step of exposing the substrate to a transformation treatment.

A transformation treatment may, in some embodiments, be carried out in the same reaction chamber as the reaction chamber in which the gap filling fluid is formed. Alternatively, and in some embodiments, the gap filling fluid may be formed in a first reaction chamber, and the transformation treatment may be carried out in a second reaction chamber. The first and second reaction chambers may be part of a cluster tool comprising 2 or more, e.g. 2, 4, 8, 16, or 32, reaction chambers.

Various transformation treatments can be employed. All transformation treatments have in common that they alter or improve the properties of a gap filling fluid in one way or another. In some embodiments, the transformation treatment comprises exposing the substrate to a plasma. Additionally or alternatively, and in some embodiments, a transformation treatment can comprise exposing the substrate to at least one of radicals and ions which can be generated, for example, in a remote plasma source. In some embodiments, the transformation treatment comprises exposing the substrate to a thermal anneal. Optionally, a thermal anneal can comprise exposing the substrate to one or more of an oxidizing agent such as an oxygen-containing gas, a nitridation agent such as a nitrogen-containing gas, a reducing agent such as a hydrogen-containing gas, and a noble gas. Additionally or alternatively, and in some embodiments, the transformation treatment can comprise exposing the substrate to ultraviolet radiation. Optionally, while exposing the substrate to ultraviolet radiation, the substrate can be exposed to one or more of an oxidizing agent, a nitridation agent, a reducing agent, and a noble gas.

In some embodiments, the transformation treatment comprises exposing the substrate to a plasma. Suitable plasmas include direct plasmas, remote plasmas, and microwave plasmas. A plasma treatment can suitably be performed in a cyclical manner, e.g. after a deposition step in a super cycle. Additionally or alternatively, a plasma treatment can be performed as a post-deposition treatment.

In some embodiments, exposing the substrate to a plasma employs generating a plasma by means of a plasma gas that comprises at least one of an oxidizing agent, a nitridation agent, a reducing agent, and an inert gas.

Employing a plasma gas comprising an oxidizing agent can result in formation of an oxide in a gap comprised in the substrate. For example, this can occur through oxidation of a metal and halogen-containing gap filling fluid. Suitable oxidizing agents include $O_2$, $H_2O$, $H_2O_2$, and $N_2O$.

Employing a plasma gas comprising a nitridation agent can result in formation of a nitride in a gap comprised in the substrate. For example, this can occur through nitridation of a metal and halogen-containing gap filling fluid. Suitable nitridation agents include $NH_3$, $N_2H_2$, and gas mixtures comprising $N_2$ and $H_2$.

Employing a plasma gas comprising a reducing agent, or a plasma gas that substantially consists of one or more noble gasses, can result in can result in formation of a metallic substance in the gap comprised in the substrate. For example, this can occur through volatilization of the halogens contained in the metal and halogen-containing gap filling fluid. In some embodiments, the plasma gas comprises, or substantially consist of, a noble gas. Suitable reducing atmospheres include $H_2$.

In some embodiments, the transformation treatment comprises exposing the substrate to at least one of radicals and ions. For example, a direct plasma treatment can comprise exposing the substrate to radicals and ions. For example, a remote plasma treatment can comprise exposing the substrate to radicals only.

In some embodiments, the transformation treatment comprises exposing the substrate to a thermal anneal. Suitable anneals are known in the Art as such, and include spike anneals, rapid thermal anneals (RTA), and soak anneals. A thermal anneal can suitably be performed in a cyclical manner, e.g. after a deposition step in a super cycle. Additionally or alternatively, an anneal can be performed as a post-deposition treatment.

In some embodiments, the thermal anneal comprises at least one of exposing the substrate to an oxidizing agent, a nitridation agent, a reducing agent, and an inert gas.

Exposing the substrate to an oxidizing agent during the thermal anneal can result in formation of an oxide in a gap comprised in the substrate. For example, this can occur through oxidation of a metal and halogen-containing gap filling fluid. Suitable oxidizing agents include $O_2$, $H_2O$, $H_2O_2$, and $N_2O$.

Exposing the substrate to a nitridation agent during the thermal anneal can result in formation of a nitride in a gap comprised in the substrate. For example, this can occur through nitridation of a metal and halogen-containing gap filling fluid. Suitable nitridation agents include $NH_3$, $N_2H_2$, and gas mixtures comprising $N_2$ and $H_2$.

Exposing the substrate to a reducing agent or to a noble gas during the thermal anneal can result in formation of a metallic substance in the gap comprised in the substrate. For example, this can occur through volatilization of the halogens contained in the metal and halogen-containing gap filling fluid. Suitable noble gasses include He, Ne, Ar, Xe, and Kr. Suitable reducing atmospheres include $H_2$.

In some embodiments, the transformation treatment comprises exposing the substrate to ultraviolet radiation. Exposing the substrate to ultraviolet radiation can occurs, for example, while exposing the substrate to at least one of an oxidizing agent, a nitridation agent, a reducing agent, and an inert gas.

In some embodiments, exposing the substrate to ultraviolet radiation comprises at least one of exposing the substrate to an oxidizing agent, a nitridation agent, a reducing agent, and an inert gas.

Exposing the substrate to an oxidizing agent while exposing the substrate to ultraviolet radiation can result in formation of an oxide in a gap comprised in the substrate. For example, this can occur through oxidation of a metal and halogen-containing gap filling fluid. Suitable oxidizing agents include $O_2$, $H_2O$, $H_2O_2$, and $N_2O$.

Exposing the substrate to a nitridation agent while exposing the substrate to ultraviolet radiation can result in formation of a nitride in a gap comprised in the substrate. For example, this can occur through nitridation of a metal and halogen-containing gap filling fluid. Suitable nitridation agents include $NH_3$, $N_2H_2$, and gas mixtures comprising $N_2$ and $H_2$.

Exposing the substrate to a reducing agent or to an inert atmosphere while exposing the substrate to ultraviolet radiation can result in formation of a metallic substance in the gap comprised in the substrate. For example, this can occur through volatilization of the halogens contained in the metal and halogen-containing gap filling fluid. Suitable inert atmospheres include atmospheres that substantially consist of a noble gas. Suitable reducing atmospheres include $H_2$.

In some embodiments, a transformation treatment comprises exposing the substrate to a reduction step and to an oxidation step. In some embodiments, the reduction step precedes the oxidation step. Alternatively, the oxidation step can precede the reduction step. In some embodiments, the reduction step comprises exposing the substrate to a hydrogen plasma. In some embodiments, the oxidation step comprises exposing the substrate to an oxygen plasma.

In some embodiments, transforming the gap filling fluid comprises exposing the substrate to a reduction step and to a nitridation step. It shall be understood that a nitridation step refers to a step of converting a material into a nitride. In some embodiments, the reduction step precedes the nitridation step. Alternatively, the nitridation step can precede the reduction step. In some embodiments, the reduction step comprises exposing the substrate to a hydrogen plasma. In some embodiments, the nitridation step comprises exposing the substrate to a nitrogen plasma. Suitable nitrogen plasmas include plasmas in which the plasma gas comprises at least one of $N_2$, $NH_3$, and $N_2H_2$.

In some embodiments, the substrate is exposed to the transformation treatment for a duration of at least 0.1 s to at most 1000 s, or of at least 0.2 s to at most 500 s, or of at least 0.5 s to at most 200 s, or of at least 1.0 s to at most 100 s, or of at least 2 s to at most 50 s, or of at least 5 s to at most 20 s.

The transformation treatment can, in some embodiments, be carried out once after the gap has been filled, or it can be carried out multiple times, i.e. gap filling steps and transformation steps can be carried out alternatingly and cyclically in order to fill a gap with a transformed material. Thus, in some embodiments, a method as described herein comprises a plurality of super cycles. A super cycle comprises a step of at least partially filling a gap comprised in a substrate with a gap filling fluid and a step of exposing the substrate to a transformation treatment. For example, a method as described herein can comprise from at least 2 to at most 5, or from at least 5 to at most 10, or from at least 10 to at most 20, or from at least 20 to at most 50, or from at least 50 to at most 100 super cycles.

The total number of super cycles comprised in a method as described herein depends, inter alia, on the total layer thickness that is desired. In some embodiments, the method comprises from at least 1 super cycle to at most 100 super cycles, or from at least 2 super cycles to at most 80 super cycles, or from at least 3 super cycles to at most 70 super cycles, or from at least 4 super cycles to at most 60 super cycles, or from at least 5 super cycles to at most 50 super cycles, or from at least 10 super cycles to at most 40 super cycles, or from at least 20 super cycles to at most 30 super cycles. In some embodiments, the method comprises at most 100 super cycles, or at most 90 super cycles, or at most 80 super cycles, or at most 70 super cycles, or at most 60 super cycles, or at most 50 super cycles, or at most 40 super cycles, or at most 30 super cycles, or at most 20 super cycles, or at most 10 super cycles, or at most 5 super cycles, or at most 4 super cycles, or at most 3 super cycles, or at most 2 super cycles, or a single super cycle.

In some embodiments, the substrate is maintained at a temperature of at least −25° C. to at most 400° C., or at a temperature of at least 0° C. to at most 200° C., or at a temperature of at least 25° C. to at most 150° C., or at a temperature of at least 50° C. to at most 100° C. during at least one of forming a gap filling fluid and during the transformation treatment.

In some embodiments, and while the gap filling fluid is transformed into a transformed material, the substrate is maintained at a temperature of less than 800° C., or of at least −25° C. to at most 800° C., or of at least 0° C. to at most 700° C., or of at least 25° C. to at most 600° C., or of at least 50° C. to at most 400° C., or of at least 75° C. to at most 200° C., or of at least 100° C. to at most 150° C. In some embodiments, the temperature at which the substrate is maintained while the gap filling fluid is formed equals the temperature at which the substrate is maintained while the gap filling fluid is transformed into a transformed material.

In some embodiments, the presently described methods are carried out at a pressure of less than 760 Torr or of at least 0.2 Torr to at most 760 Torr, of at least 1 Torr to at most 100 Torr, or of at least 1 Torr to at most 10 Torr. In some embodiments, the convertible layer is deposited at a pressure of at least 10.0 Torr, or at a pressure of at least 5.0 Torr, or at a pressure of at least 3.0 Torr, or at a pressure of at least 2.0 Torr, or at a pressure of at least 1.0 Torr. or at a pressure of at least 1 Torr to at most 10 Torr In some embodiments, the precursor comprises an element selected from Ge, Sb, and Te.

Suitably, when the precursor Ge, the reactant can contain a fluorine-containing gas or vapor. Thus, a gap filling fluid comprising at least one of $GeF_2$ and $GeF_4$ can be formed.

Suitably, when the precursor comprises Sb, the reactant can contain a fluorine-containing gas or vapor. Thus, a gap filling fluid comprising at least one of $SbF_3$ and $SbF_5$ can be formed.

Suitably, when the precursor comprises Te, the reactant can contain a bromine-containing gas or vapor. Thus, a gap filling fluid comprising $Te_2Br$ can be formed.

In some embodiments, the precursor can comprise an element selected from Nb, Ta, V, Ti, Zr, and Hf.

In some embodiments, the precursor can comprise niobium (Nb). In such embodiments, the reactant can suitably comprise at least one of chlorine and iodine. Accordingly, a gap filling fluid comprising at least one of $NbCl_4$ and $NbI_5$ can be formed.

In some embodiments, the precursor can comprise tantalum (Ta). In such embodiments, the reactant can suitably comprise one of fluorine, chlorine, bromine, and iodine. Accordingly, a gap filling fluid comprising at least one of $TaCl_5$, $TaI_5$, $TaF_5$, and $TaBr_5$ can be formed.

In some embodiments, the precursor can comprise vanadium (V). In such embodiments, the reactant can suitably comprise one of fluorine and bromine. Accordingly, a gap filling fluid comprising at least one of $VF_4$, $VF_5$, $VBr_3$ can be formed.

In some embodiments, the precursor can comprise V, the reactant comprises O, and at least one of the precursor and the reactant comprises a halogen, such as F or Cl. Accordingly, a gap filling fluid containing vanadium, oxygen, and a halogen can be obtained. Examples of such gap filling fluids include $VOCl_2$, $V_2O_2F_4$, $VOCl_3$, and $VOF_3$.

In some embodiments, the precursor can comprise titanium (Ti). In such embodiments, the reactant can suitably comprise fluorine. Accordingly, a gap filling fluid comprising $TiF_4$ can be formed.

In some embodiments, the precursor can comprise zirconium (Zr). In such embodiments, the reactant can suitably comprise one of chlorine, bromine, and iodine. Accordingly, a gap filling fluid comprising at least one of $ZrI_4$, $ZrCl_4$, and $ZrBr_4$ can be formed.

In some embodiments, the precursor can comprise Zr, the reactant comprises a H and O gas mixture or compound, e.g. $H_2O$, and at least one of the precursor and the reactant comprises a halogen, such as F. In such embodiments, a gap filling fluid containing $ZrF_6(H_2O)_2$ can be used.

In some embodiments, the precursor can comprise hafnium (Hf). In such embodiments, the reactant can suitably comprise one of chlorine and iodine. Accordingly, a gap filling fluid comprising at least one of $HfCl_4$ and $HfI_4$ can be formed.

In some embodiments, the precursor can comprise rhodium (Rh). In such embodiments, the reactant can suitably comprise bromine. Accordingly, a gap filling fluid comprising $RhBr_3$ can be formed.

In some embodiments, the precursor can comprise iron (Fe). In such embodiments, the reactant can suitably comprise bromine. Accordingly, a gap filling fluid comprising at least one of $FeBr_3$ and $FeBr_2$ can be formed.

In some embodiments, the precursor can comprise chromium (Cr). In such embodiments, the reactant can suitably comprise fluorine. Accordingly, a gap filling fluid comprising $CrF_5$ can be formed.

In some embodiments, the precursor can comprise molybdenum (Mo). In such embodiments, the reactant can suitably comprise chlorine, bromine, or iodine. Accordingly, a gap filling fluid comprising at least one of $Mo_6Cl_{12}$, $MoCl_4$, $MoI_3$, and $MoBr_3$ can be formed.

In some embodiments, the precursor comprises gold (Au). In such embodiments, the reactant can suitably comprise fluorine or bromine. Accordingly, a gap filling fluid comprising at least one of $AuF_3$ and $AuBr$ can be formed.

In some embodiments, the precursor comprises silver (Ag). In such embodiments, the reactant can suitably comprise fluorine. Accordingly, a gap filling fluid comprising $AgF_3$ can be formed.

In some embodiments, the precursor comprises platinum (Pt). In such embodiments, the reactant can suitably comprise bromine. Accordingly, a gap filling fluid comprising $PtBr_4$ can be formed.

In some embodiments, the precursor comprises nickel (Ni). In such embodiments, the reactant can suitably comprise bromine. Accordingly, a gap filling fluid comprising $NiBr_2$ can be formed.

In some embodiments, the precursor comprises copper (Cu). In such embodiments, the reactant can suitably comprise bromine. Accordingly, a gap filling fluid comprising $CuBr_2$ can be formed.

In some embodiments, the precursor comprises cobalt (Co). In such embodiments, the reactant can suitably comprise iodine. Accordingly, a gap filling fluid comprising CoI can be formed.

In some embodiments, the precursor can comprise Co, the reactant comprises a H and O gas mixture or compound, e.g. $H_2O$, and at least one of the precursor and the reactant comprises a halogen, such as Cl. In such embodiments, a gap filling fluid containing $CoCl_2(H_2O)_2$ can be formed.

In some embodiments, the precursor comprises zinc (Zn), for example metallic Zn or an inorganic Zn compound. In such embodiments, the reactant can suitably comprise at least one of chlorine and iodine. Accordingly, a gap filling fluid comprising at least one of $ZnCl_2$ and $ZnI_2$ can be formed.

In some embodiments, the precursor can comprise aluminum (Al). In such embodiments, the reactant can suitably comprise chlorine or iodine. Accordingly, a gap filling fluid comprising at least one of $AlCl_3$ and $AlI_3$ can be formed.

In some embodiments, the precursor can comprise indium (In). In such embodiments, the reactant can suitably comprise bromine. Accordingly, a gap filling fluid comprising $InBr_3$ can be formed.

In some embodiments, the precursor comprises tin (Sn). In such embodiments, the reactant can suitably comprise at least one of chlorine and bromine. Accordingly, a gap filling fluid comprising at least one of $SnCl_2$ and $SnBr_2$ can be formed.

In some embodiments, the precursor can comprise bismuth (Bi). In such embodiments, the reactant can suitably comprise fluorine. Accordingly, a gap filling fluid comprising $BiF_5$ can be formed.

Further described herein is a system that comprises a reaction chamber, a precursor gas source that comprises a metal or metalloid precursor, a deposition reactant gas source comprising a deposition reactant, and a controller. The controller is configured to control gas flow into the reaction chamber to form a layer on a substrate by means of a method as described herein.

Optionally, the system further comprises one or more of an active species source and a transformation reactant source. An exemplary active species source include a remote plasma source. Exemplary active species include radicals. The active species source is, if present, arranged for providing an active species to the reaction chamber. The transformation reactant source is, if present, arranged for providing a conversion reactant to the reaction chamber.

In some embodiments, the system comprises two distinct, i.e. separate, reaction chambers: a first reaction chamber and a second reaction chamber. The first reaction chamber is configured for forming a gap filling fluid on the substrate. The second reaction chamber is configured for converting the gap filling fluid into a converted material. In some embodiments, the first reaction chamber is maintained at a first reaction chamber temperature, and the second reaction chamber is maintained at a second reaction chamber temperature. In some embodiments, the first reaction chamber temperature is lower than the second reaction chamber temperature, for example from at least 10° C. lower to at most 100° C. lower. In some embodiments, the first reaction chamber temperature is higher than the second reaction chamber temperature, for example from at least 10° C. higher to at most 100° C. higher. In some embodiments, the first reaction chamber temperature is equal to the second reaction chamber temperature, e.g. within a margin of 10° C., 20° C., 30° C., or 40° C.

While a method as described herein can be performed using a direct plasma, remote plasmas may be suitably used in addition, or as an alternative, in some embodiments. Thus further described is a method of filling a gap. The method comprises providing a substrate. The substrate comprises the gap. The method further comprises providing a system. The system comprises a reaction chamber and a remote plasma source. The method further comprises providing a precursor as described herein to the reaction chamber. The method further comprises providing a reactant as described herein to the remote plasma source. The method further comprises generating a plasma in the remote plasma source. Thus, a plasma species is created in the remote plasma source, by means of the plasma and by means of the reactant. The method further comprises transporting the plasma species from the remote plasma source to the reaction chamber. It shall be understood that the precursor comprises a metal or a metalloid. Also, at least one of the precursor and the reactant comprises a halogen. Thus, the precursor and the reactant are allowed to form a gap filling fluid, and at least part of the gap is filled with the gap filling fluid. It shall be understood that the gap filling fluid comprises the metal or the metalloid. In some embodiments, the gap filling fluid further comprises the halogen. In some embodiments, the gap filling fluid does not comprise the halogen.

The substrate can be exposed to the precursor and the plasma species alternatingly, e.g. in a series of alternating precursor pulses and plasma species pulses. Alternatively, the substrate can be continuously exposed to the plasma species, and precursor exposure can be pulsed. Alternatively, the substrate can be continuously exposed to the precursor and exposing the substrate to the plasma species can occur in a pulsed manner. Alternatively, the substrate can be simultaneously and continuously exposed to precursor and plasma species.

In some embodiments, a method as described herein can be carried out in a system comprising two reaction chambers, in at least one of which a plasma is generated either continuously or in a pulsed fashion. Thus, further described herein is a method for filling a gap. The method comprises providing a substrate. The substrate comprises the gap. The method further comprises providing a system that comprises a first reaction chamber and a second reaction chamber. The method further comprises providing a precursor to the first reaction chamber. The method further comprises providing a reactant to the second reaction chamber. The method further comprises generating a plasma in at least one of the first reaction chamber and the second reaction chamber, such as in the first reaction chamber, in the second reaction chamber, or both. The method further comprises executing a plurality of deposition cycles. A deposition cycle comprises moving the substrate to the first reaction chamber, and moving the substrate to the second reaction chamber. It shall be understood that at least one of the precursor and the reactant comprise a metal or a metalloid, and at least one of the precursor and the reactant comprise a halogen. Thus, the precursor and the reactant are allowed to form a gap filling fluid, and the gap is at least partially filled with the gap filling fluid. It shall be understood that the gap filling fluid comprises the metal or metalloid. In some embodiments, the gap filling fluid further comprises the halogen. In some embodiments, the gap filling fluid does not comprise the halogen.

In an alternative configuration, a method as described herein can be carried out in a system comprising two reaction chambers, at least one of which is operationally connected to a remote plasma source. Thus, further described herein is a method of filling a gap, the method comprises providing a substrate. The substrate comprises the gap. The method further comprises providing a system. The system comprises a first reaction chamber, a second reaction chamber, and a remote plasma source. The method further comprises providing a precursor to the first reaction chamber. The method further comprises providing a reactant to the remote plasma source. The method further comprises generating a plasma in the remote plasma source. Thus, a plasma species is created in the remote plasma source. The method further comprises transporting the plasma species from the remote plasma source to the second reaction chamber. The method further comprises executing a plurality of deposition cycles. A deposition cycle comprises moving the substrate to the first reaction chamber, and moving the substrate to the second reaction chamber. It shall be understood that the precursor comprises a metal or metalloid, and at least one of the precursor and the reactant comprise a halogen. Thus, the precursor and the reactant are allowed to form a gap filling fluid, and at least a part of the gap is filled with the gap filling fluid. The gap filling fluid comprises the metal or the metalloid. In some embodiments, the gap filling fluid further comprises the halogen. In some embodiments, the gap filling fluid does not comprise the halogen.

In accordance with yet additional embodiments of the disclosure, a device or portion thereof can be formed using a method and/or a structure as described herein. The device can include a substrate, one or more insulating layers, one or more metallic layers, and one or more semiconducting layers. The device further comprises a gap filled using a method as disclosed herein.

Further described is a field effect transistor comprising a gate contact comprising a layer formed according to a method as described herein.

Further described is a metal contact comprising a layer deposited by means of a method as described herein.

Further provided herein is a metal-insulator-metal (MIM) capacitor comprising an electrode comprising a material formed by means of a method as described herein.

FIG. 1 shows a schematic representation of an embodiment of a method as described herein. The method can be used, for example, in order to form an electrode in a semiconductor device. However, unless otherwise noted, the presently described methods are not limited to such applications. The method comprises a step (111) of positioning a substrate on a substrate support. The substrate support is positioned in a reaction chamber. Suitable substrate supports include pedestals, susceptors, and the like. The method further comprises filling a gap comprised in the substrate (112) with a gap filling fluid. While filling the gap, the substrate is exposed to active species. The active species can be generated, for example, by means of a direct plasma, an indirect plasma, or a remote plasma. Suitable gap filling fluids and methods of forming them are described elsewhere herein. Optionally, the reaction chamber is then purged. When a sufficient amount of gap filling fluid has been formed in the gap, the method ends (113).

Figure 2:
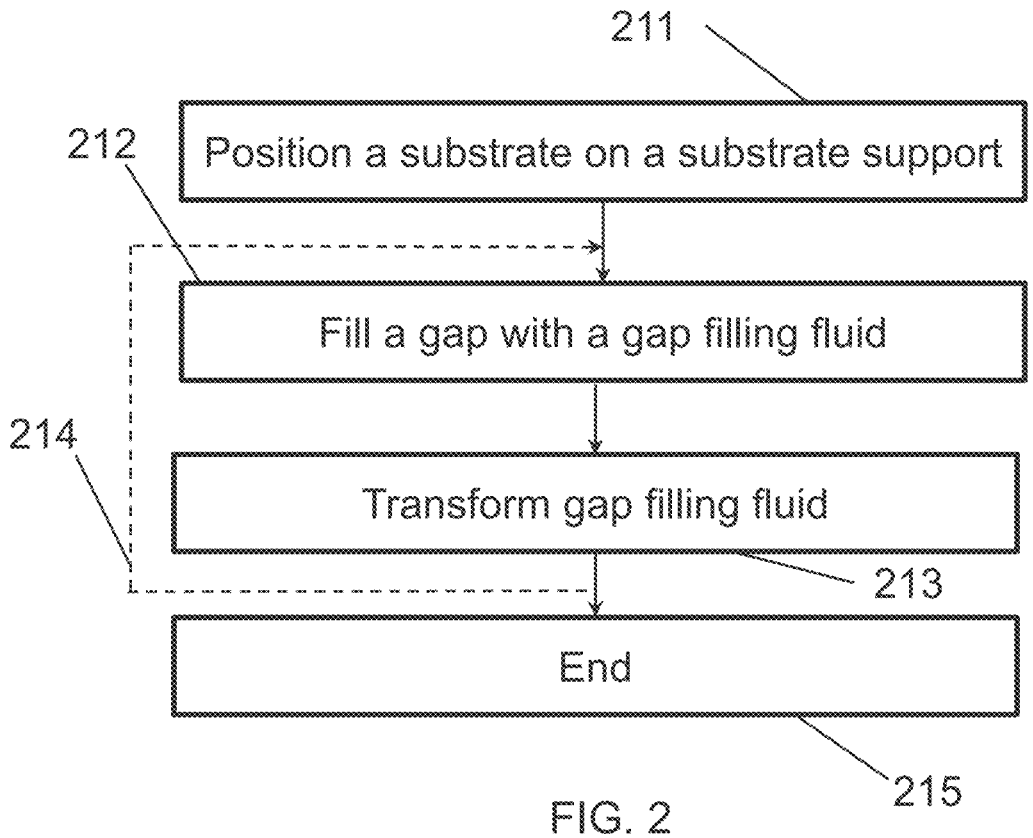
FIG. 2 illustrates an embodiment of a method as disclosed herein.

FIG. 2 schematically shows another embodiment of a method as described herein. The method of FIG. 2 is similar to that of FIG. 1 in the sense that it also comprises positioning a substrate on a substrate support (211) and filling a gap with a gap filling fluid (212). The method of FIG. 2 differs from the method of FIG. 1 in that it further comprises a step of transforming the gap filling fluid (213) to form a transformed material. While filling the gap, the substrate is exposed to active species. The active species can be generated, for example, by means of a direct plasma, an indirect plasma, or a remote plasma. Optionally, a purge is carried out after the step of transforming the gap filling fluid (213). The step of transforming the gap filling fluid (213) can comprise, for example, exposing the substrate to a direct plasma such as a direct oxygen plasma or a direct nitrogen plasma. Alternatively, the step of transforming the gap filling fluid (213) can comprise a thermal transformation process that comprises exposing the substrate to a transformation reactant, without simultaneously exposing the substrate to an active species, e.g. a plasma-generated active species. Optionally, the method of FIG. 2 comprises a plurality of super cycles (214) in which the steps of filling the gap with the gap filling fluid (212) and transforming the gap filling fluid (213) are repeated one or more times. After a predetermined amount of converted material has been formed on the substrate, the method of FIG. 2 ends (215).

Figure 3:
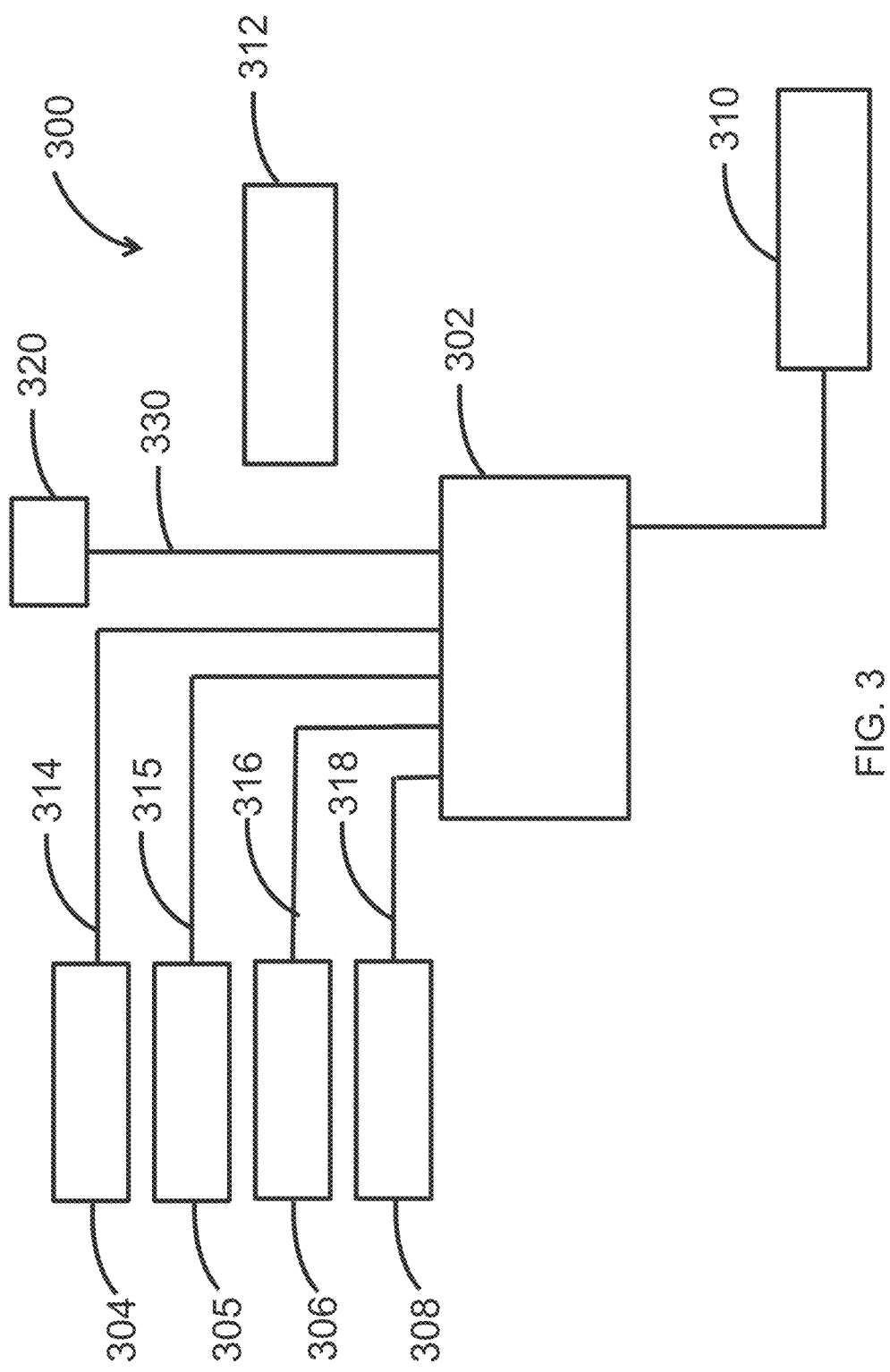
FIG. 3 illustrates an embodiment of a system (300) in accordance with yet additional exemplary embodiments of the disclosure.

FIG. 3 illustrates a system (300) in accordance with yet additional exemplary embodiments of the disclosure. The system (300) can be used to perform a method as described herein and/or form a structure or device portion, e.g. in an integrated circuit, as described herein.

In the illustrated example, the system (300) includes one or more reaction chambers (302), a precursor gas source (304), a reactant gas source (306), a purge gas source (308), an exhaust (310), and a controller (312).

The reaction chamber (302) can include any suitable reaction chamber, such as an ALD or CVD reaction chamber.

Of course, and in some embodiments, other plasmas can be used in addition or as an alternative to the remote plasma. Suitable additional or alternative plasmas include indirect plasmas and direct plasmas. Thus, and in some embodiments, the reaction chamber comprises a showerhead injector, a substrate support, and a direct plasma source (none of which are shown). In exemplary modes of operation, an RF bias can be applied to the showerhead injector by the direct plasma source, and the substrate support can be grounded. Thus, a substrate can be efficiently exposed to a direct plasma that can be useful, for example, when converting a gap filling fluid or a solidified material into a converted material.

The precursor gas source (304) can include a vessel and one or more precursors as described herein—alone or mixed with one or more carrier (e.g., noble) gases. The reactant gas source (306) can include a vessel and one or more reactants as described herein—alone or mixed with one or more carrier gases. The purge gas source (308) can include one or more inert gases as described herein. Although illustrated with four gas sources (304-308), the system (300) can include any suitable number of gas sources. The gas sources (304-308) can be coupled to reaction chamber (302) via lines (314-318), which can each include flow controllers, valves, heaters, and the like. The exhaust (310) can include one or more vacuum pumps.

The system (300) of FIG. 3 comprises a remote plasma source (320) that is operationally coupled to the reaction chamber (302). Suitable remote plasma sources (320) as such are known in the Art, and comprise inductively coupled plasma sources, microwave plasma sources, and capacitive plasma sources. A remote plasma source can be positioned adjacent to the reaction chamber, or the remote plasma source can be positioned at a certain distance from the reaction chamber, e.g. at a distance of at least 1.0 m to at most 10.0 m. When the remote plasma source (320) is positioned at a certain distance from the reaction chamber (302), the remote plasma source (320) can be operationally connected to the reaction chamber (302) via an active species duct (330). The active species duct can comprise a pipe. Optionally, the pipe can contain one or more mesh plates. The mesh plates can at least partially block some reactive species such as ions and electromagnetic radiation while letting other reactive species, e.g. radicals, pass.

The controller (312) includes electronic circuitry and software to selectively operate valves, manifolds, heaters, pumps and other components included in the system (300). Such circuitry and components operate to introduce precursors, reactants, and purge gases from the respective sources (304-308). The controller (312) can control timing of gas pulse sequences, temperature of the substrate and/or reaction chamber, pressure within the reaction chamber, and various other operations to provide proper operation of the system (300). The controller (312) can include control software to electrically or pneumatically control valves to control flow of precursors, reactants and purge gases into and out of the reaction chamber (302). The controller (312) can include modules such as a software or hardware component, e.g., a FPGA or ASIC, which performs certain tasks. A module can advantageously be configured to reside on the addressable storage medium of the control system and be configured to execute one or more processes.

Other configurations of the system (300) are possible, including different numbers and kinds of precursor and reactant sources and purge gas sources. Further, it will be appreciated that there are many arrangements of valves, conduits, precursor sources, and purge gas sources that may be used to accomplish the goal of selectively feeding gases into the reaction chamber (302). Further, as a schematic representation of a system, many components have been omitted for simplicity of illustration, and such components may include, for example, various valves, manifolds, purifiers, heaters, containers, vents, and/or bypasses.

During operation of the system (300), substrates, such as semiconductor wafers (not illustrated), are transferred from, e.g., a substrate handling system to reaction chamber (302). Once such substrate(s) are transferred to reaction chamber (302), one or more gases from the gas sources (304-308), such as precursors, reactants, carrier gases, and/or purge gases, are introduced into the reaction chamber (302).

Figure 4:
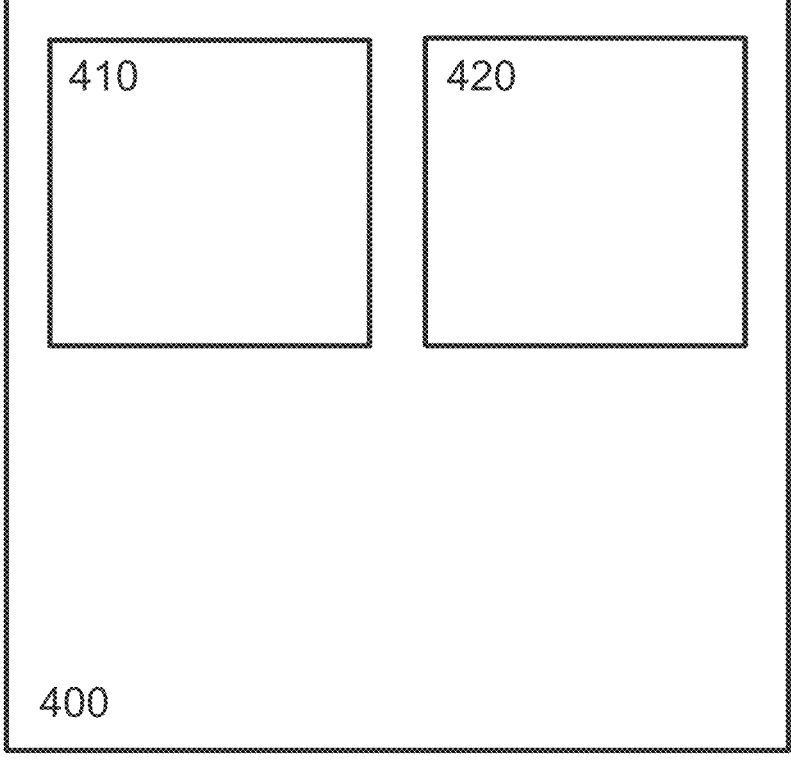
FIG. 4 shows another embodiment of a system (400) as described herein in a stylized way.

FIG. 4 shows another embodiment of a system (400) as described herein in a stylized way. The system (400) of FIG. 4 is similar to that of FIG. 3. It comprises two distinct reaction chambers: a first reaction chamber (410) and a second reaction chamber (420). The first reaction chamber (410) is arranged for filling a gap with a gap filling fluid. The second reaction chamber (420) is arranged for transforming the gap filling fluid into a transformed material.

Figure 5:
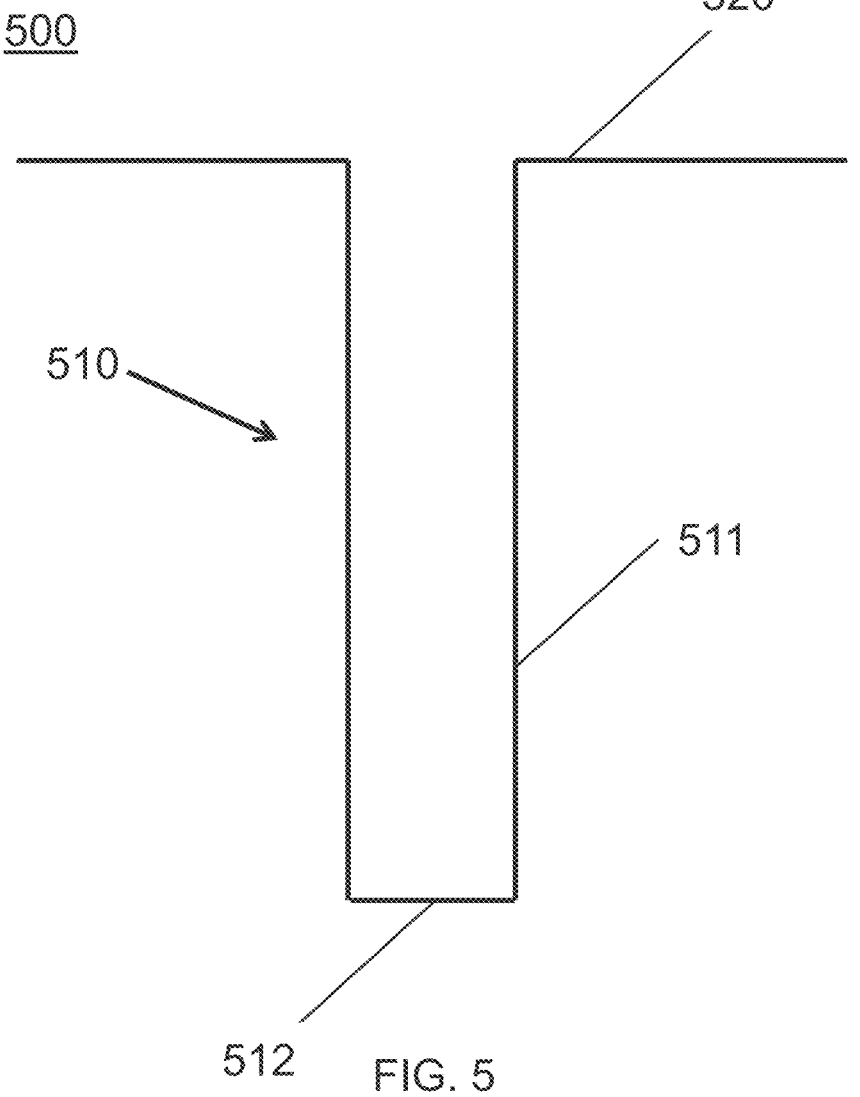
FIG. 5 shows a stylized representation of a substrate (500) comprising a gap (510).

FIG. 5 shows a schematic representation of a substrate (500) comprising a gap (510). The gap (510) comprises a sidewall (511) and a distal end (512). The substrate further comprises a proximal surface (520), i.e. a surface of the substrate outside of the gap. In some embodiments, the sidewall (511), the distal end (512) comprise the same material. In some embodiments, at least one of the sidewall (511) and the distal end comprise a dielectric, such as a silicon containing dielectric such as silicon oxide, silicon nitride, silicon carbide, and mixtures thereof. In some embodiments, the dielectric comprises hydrogen. In some embodiments, at least one of the sidewall (511) and the distal end (512) comprise a metal such as a transition metal, a post transition metal, and a rare earth metal. In some embodiments, the metal comprises Cu, Co, W, Ru, Mo, Al, or an alloy thereof.

In some embodiments, the sidewall (511) and the distal end (512) have an identical, or a substantially identical, composition. In some embodiments, the sidewall (511) and the distal end (512) have a different composition. In some embodiments, the sidewall and the distal end (512) comprise a dielectric. In some embodiments, the sidewall (511) and the distal end (512) comprise a metal. In some embodiments, the sidewall (511) comprises a metal and the distal end (512) comprises a dielectric. In some embodiments, the sidewall (511) comprises a dielectric and the distal end comprises a metal.

In some embodiments, the proximal surface (520) has the same composition as the sidewall (511). In some embodiments, the proximal surface (520) has a different composition than the sidewall (511). In some embodiments, the proximal surface (520) has a different composition than the distal end (512). In some embodiments, the proximal surface (520) has the same composition as the distal end (512).

In some embodiments, the proximal surface (520), the sidewall (511), and the distal end (512) comprise the same material. In some embodiments, the proximal surface (520), the sidewall (511), and the distal end (512) comprise a dielectric. In some embodiments, the proximal surface (520), the sidewall (511), and the distal end (512) comprise a metal. In some embodiments, the proximal surface (520), the sidewall (511), and the distal end (512) comprise a semiconductor.

Figure 6:
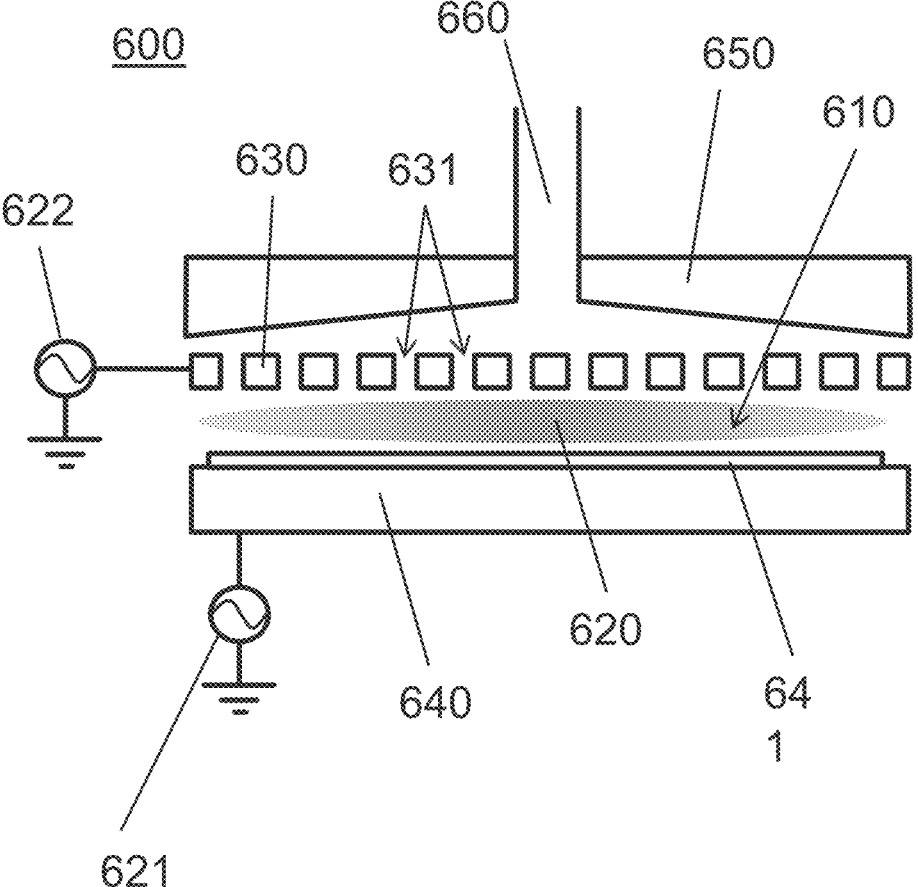
FIG. 6 shows a schematic representation of an embodiment of a system (600) as described herein.

FIG. 6 shows a schematic representation of an embodiment of a system (600) as described herein. The system (600) comprises a reaction chamber (610) in which a plasma (620) is generated. In particular, the plasma (620) is generated between a showerhead injector (630) and a substrate support (640).

In the configuration shown, the system (600) comprises two alternating current (AC) power sources: a high frequency power source (621) and a low frequency power source (622). In the configuration shown, the high frequency power source (621) supplies radio frequency (RF) power to the showerhead injector, and the low frequency power source (622) supplies an alternating current signal to the substrate support (640). The radio frequency power can be provided, for example, at a frequency of 13.56 MHz or higher, e.g. at a frequency of at least 100 KHz to at most 50 MHz, or at a frequency of at least 50 MHz to at most 100 MHz, or at a frequency of at least 100 MHz to at most 200 MHz, or at a frequency of at least 200 MHz to at most 500 MHz, or at a frequency of at least 500 MHz to at most 1000 MHz, or at a frequency of at least 1000 MHz to at most 2000 MHz. The low frequency alternating current signal can be provided, for example, at a frequency of 2 MHz or lower, such as at a frequency of at least 100 kHz to at most 200 kHz, or at a frequency of at least 200 kHz to at most 500 kHz, or at a frequency of at least 500 kHz to at most 1000 kHz, or at a frequency of at least 1000 kHz to at most 2000 kHz.

Process gas comprising precursor, reactant, or both, is provided through a gas line (660) to a conical gas distributor (650). The process gas then passes through through holes (631) in the showerhead injector (630) to the reaction chamber (610).

Whereas the high frequency power source (621) is shown as being electrically connected to the showerhead injector, and the low frequency power source (622) is shown as being electrically connected to the substrate support (640), other configurations are possible as well. For example, in some embodiments (not shown), both the high frequency power source and the low frequency power source can be electrically connected to the showerhead injector; or both the high frequency power source and the low frequency power source can be electrically connected to the substrate support; or the high frequency power source can be electrically connected to the substrate support, and the low frequency power source can be electrically connected to the showerhead injector.

Figure 7:
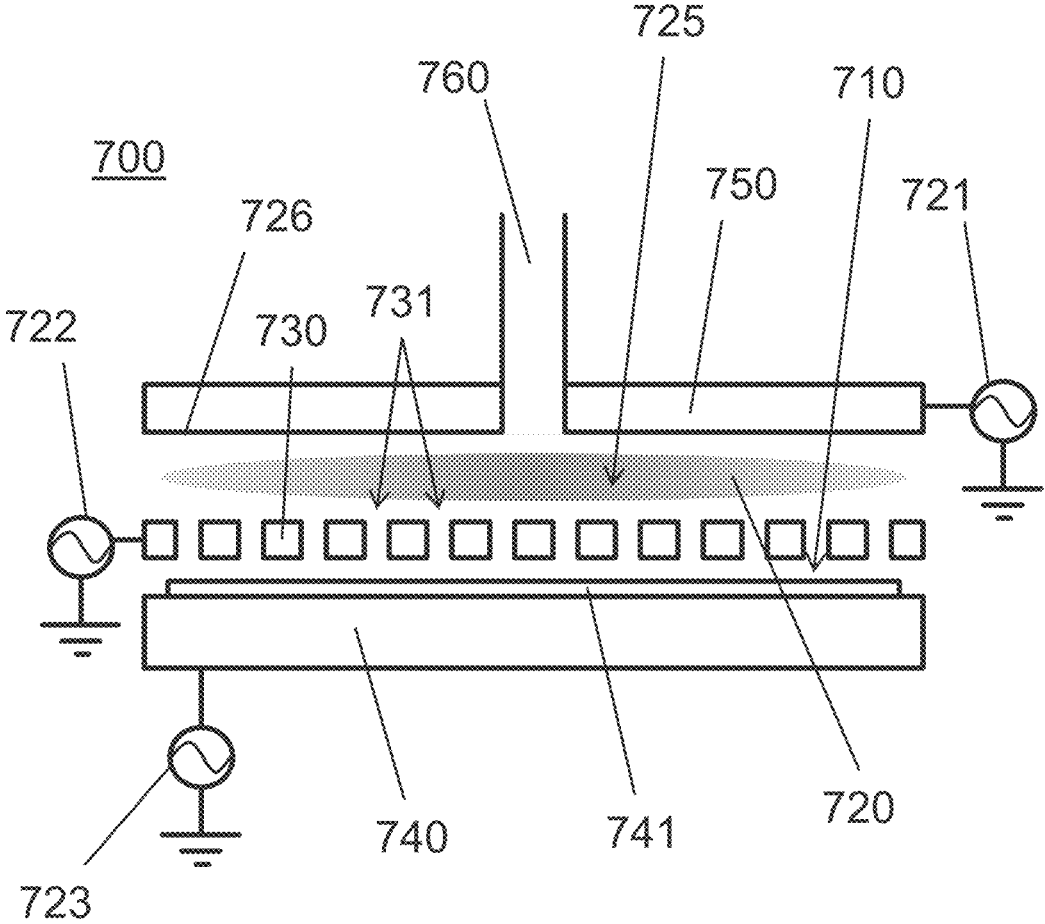
FIG. 7 shows a schematic representation of another embodiment of a system (700) as described herein.

FIG. 7 shows a schematic representation of another embodiment of a system (700) as described herein. The system (700) comprises a reaction chamber (710) which is separated from a plasma generation space (725) in which a plasma (720) is generated. In particular, the reaction chamber (710) is separated from the plasma generation space (725) by a showerhead injector, and the plasma (720) is generated between the showerhead injector (730) and a plasma generation space ceiling (726).

In the configuration shown, the system (700) comprises three alternating current (AC) power sources: a high frequency power source (721) and two low frequency power sources (722,723): a first low frequency power source (722) and a second low frequency power source (723). In the configuration shown, the high frequency power source (721) supplies radio frequency (RF) power to the plasma generation space ceiling, the first low frequency power source (722) supplies an alternating current signal to the showerhead injector (730), and the second low frequency power source (723) supplies an alternating current signal to the substrate support (740). A substrate (741) is provided on the substrate support (740). The radio frequency power can be provided, for example, at a frequency of 13.56 MHz or higher. The low frequency alternating current signal of the first and second low frequency power sources (722,723) can be provided, for example, at a frequency of 2 MHz or lower.

Process gas comprising precursor, reactant, or both, is provided through a gas line (760) that passes through the plasma generation space ceiling (726), to the plasma generation space (725). Active species such as ions and radicals generated by the plasma (725) from the process gas pass through holes (731) in the showerhead injector (730) to the reaction chamber (710).

Figure 8:
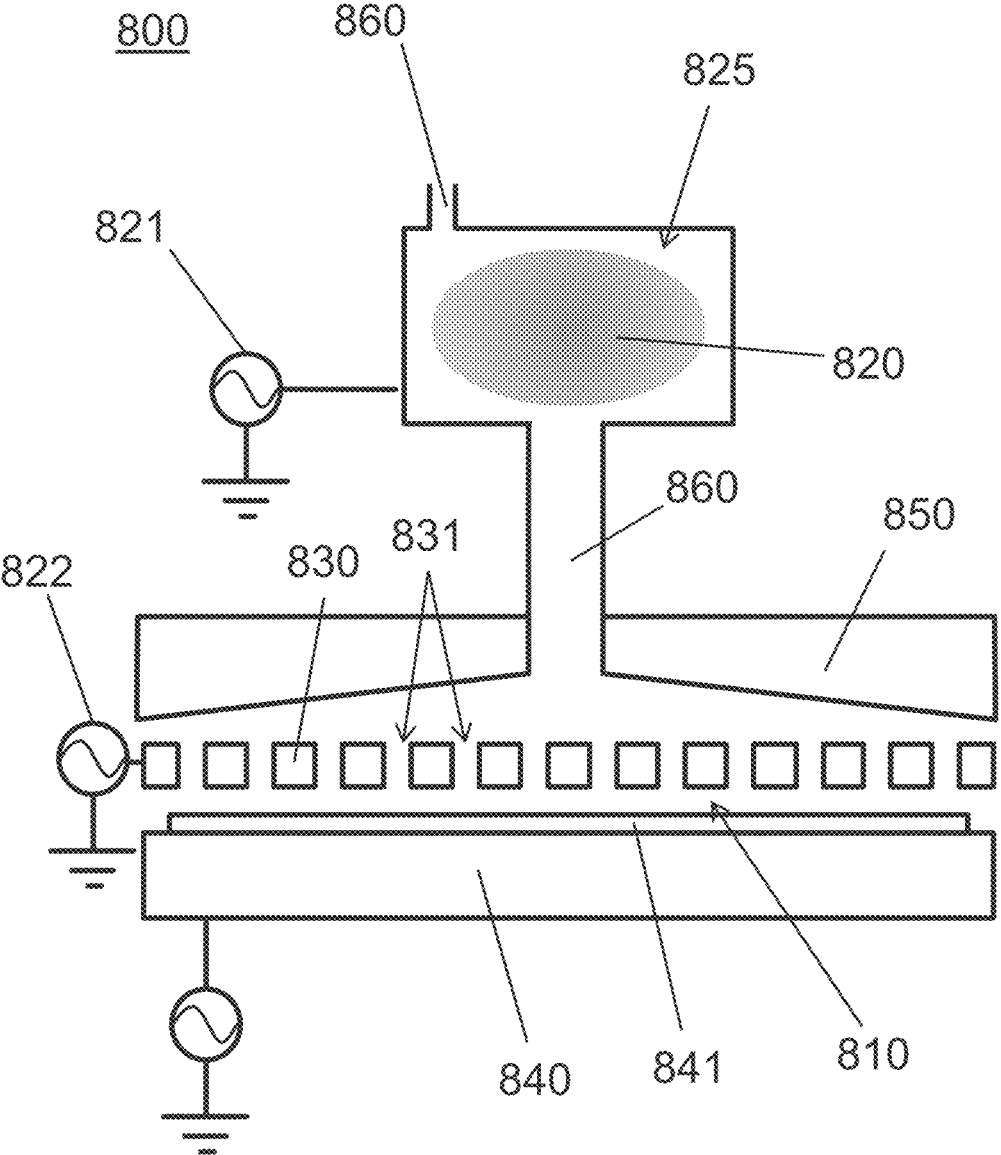
FIG. 8 shows a schematic representation of another embodiment of a system (800) as described herein.

FIG. 8 shows a schematic representation of another embodiment of a system (800) as described herein. The system (800) comprises a reaction chamber (810) which is operationally connected to a remote plasma source (825) in which a plasma (820) is generated. Any sort of plasma source can be used as a remote plasma source (825), for example an inductively coupled plasma, a capacitively coupled plasma, or a microwave plasma.

In particular, active species are provided from the plasma source (825) to the reaction chamber (810) via an active species duct (860), to a conical distributor (850), through holes (831) in a shower plate injector (830), to the reaction chamber (810). Thus, active species can be provided to the reaction chamber in a uniform way.

In the configuration shown, the system (800) comprises three alternating current (AC) power sources: a high frequency power source (821) and two low frequency power sources (822,823): a first low frequency power source (822) and a second low frequency power source (823). In the configuration shown, the high frequency power source (821) supplies radio frequency (RF) power to the plasma generation space ceiling, the first low frequency power source (822) supplies an alternating current signal to the showerhead injector (830), and the second low frequency power source (823) supplies an alternating current signal to the substrate support (840). A substrate (841) is provided on the substrate support (840). The radio frequency power can be provided, for example, at a frequency of 13.56 MHz or higher. The low frequency alternating current signal of the first and second low frequency power sources (822,823) can be provided, for example, at a frequency of 2 MHz or lower.

In some embodiments (not shown), an additional high frequency power source can be electrically connected to the substrate support. Thus, a direct plasma can be generated in the reaction chamber.

Process gas comprising precursor, reactant, or both, is provided to the plasma source (825) by means of a gas line (860). Active species such as ions and radicals generated by the plasma (825) from the process gas are guided to the reaction chamber (810).

Figure 9:
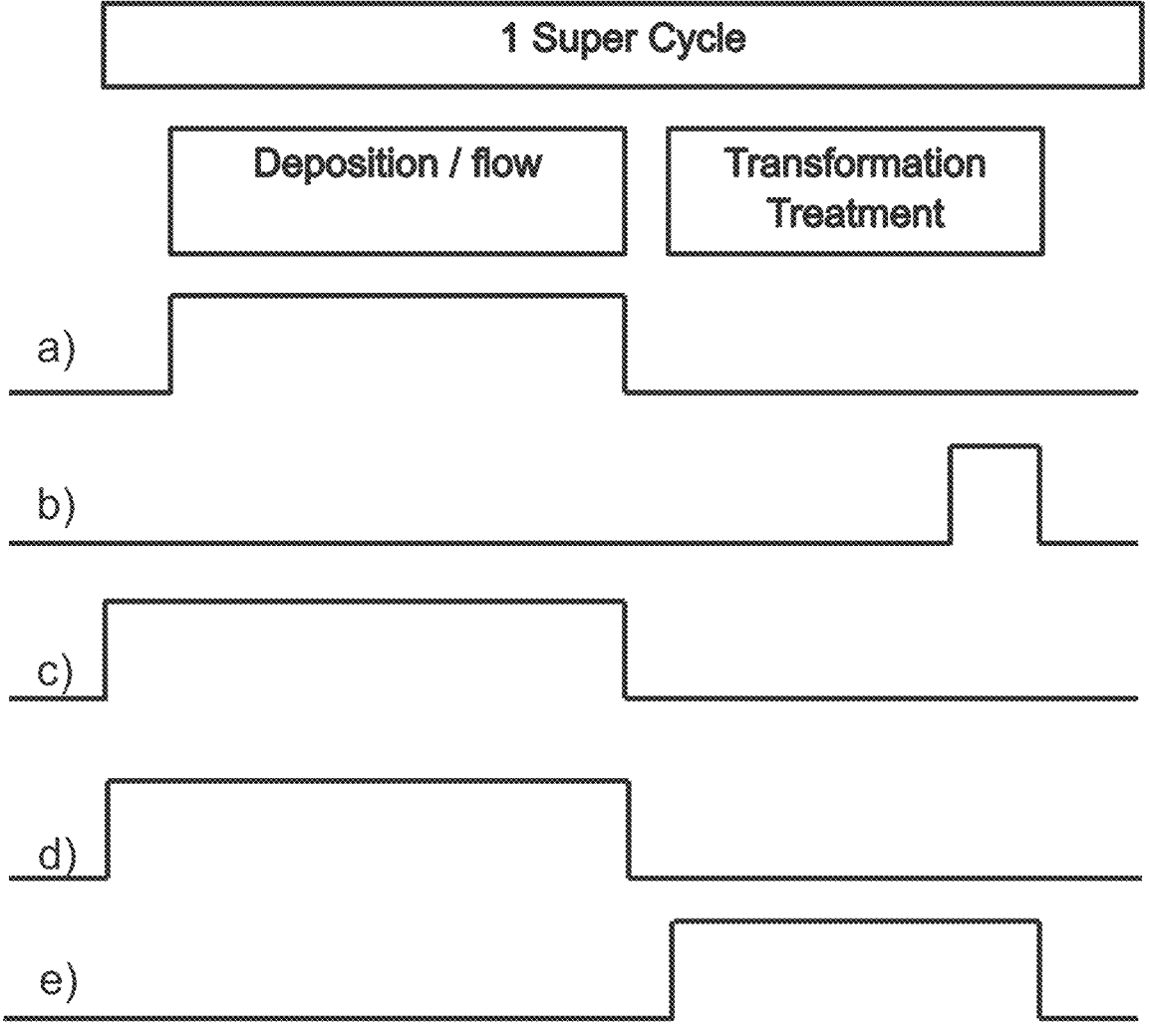
FIG. 9 shows the time evolution of several parameters in an embodiment of a method as described herein.

FIG. 9 shows the time evolution of several parameters in embodiments of a method as described herein. This embodiment is carried out in a system comprising a reaction chamber, a direct plasma source, and a remote plasma source. In particular, FIG. 9 shows processes comprising a super cycle.

FIG. 9, line a) denotes a deposition/flow step. During the deposition step, the substrate is exposed to precursor. During the transformation treatment, the substrate is not exposed to precursor. The precursor can be provided to a remote plasma source, or to a reaction space comprising the substrate, or both.

FIG. 9, line b) denotes exposure of the substrate to a direct radio frequency (RF) plasma. During the deposition step, the substrate is not exposed to a direct RF plasma. During at least a part of the transformation treatment, the substrate is exposed to a direct RF plasma.

FIG. 9, line c) denotes providing a halogen-containing gas and an ignition gas to a remote plasma source. During the deposition step, the halogen-containing gas and the ignition gas can be provided to the remote plasma source. During the transformation treatment, the flow halogen-containing gas and ignition gas is stopped. In the embodiment shown, the halogen-containing gas and the ignition gas are provided to the remote plasma source even before the deposition step starts.

FIG. 9 line d) denotes providing RF power to the remote plasma source. During the deposition step, RF power is provided to the remote plasma source. Hence, the remote plasma source is on during the deposition step. During the transformation treatment, no RF power is provided to the remote plasma source. In the embodiment shown, RF power is provided to the remote plasma source even before the deposition step starts.

Providing halogen-containing gas, ignition gas, and RF power to the remote plasma source before the deposition step starts, advantageously allows for obtaining a uniform and time-stable gas composition in the remote plasma source before precursor flow starts, and the actual deposition starts.

FIG. 9 line e) denotes exposing the substrate to transformation treatment process gas. Suitable transformation treatment process gasses include noble gasses such as He and Ar, oxygen reactants such as $H_2O$ and $O_2$, nitrogen reactants such as $NH_3$, carbon reactants such as $CH_4$, and reducing agents such as $H_2$.

Optionally, DC or low frequency AC bias can be applied during the deposition step, the transformation treatment, or both to a suitable component comprised in the system such as a substrate support or a showerhead injector.

The process of FIG. 9 causes formation of a gap filling fluid in gaps comprised in the substrate during the deposition step. During the transformation treatment, the gap filling fluid is transformed, e.g. through densification, volatilization of some components, reduction, oxidation, nitrification, or carburization.

In some embodiments (not shown), the method can comprise a plurality of super cycles, either one super cycle directly following a previous super cycle, or subsequent super cycles being separated by an inter super cycle purge. A super cycle comprises a deposition step, and a transformation treatment. The deposition step can alternatively be named a deposition/flow step. In some embodiments, the deposition step and the transformation treatment are executed directly after another. Alternatively, a purge can be executed between a deposition step and a transformation treatment, before a deposition step, and/or between a transformation treatment and a subsequent deposition step.

In some embodiments, a purge before a deposition step comprises stopping precursor flow, stopping direct plasma RF power, and stopping exposing the substrate to transformation treatment process gas. During at least part of the purge before a deposition step, halogen-containing gas and an ignition gas and RF power can be provided to the remote plasma source, thereby enhancing process stability.

In some embodiments, a purge between a deposition step and a transformation treatment comprises throttling precursor flow, not providing direct plasma RF power, not exposing the substrate to transformation treatment process gas, not providing halogen-containing gas and an ignition gas to the remote plasma source, and not providing RF power to the remote plasma source.

In some embodiments, a purge after a transformation treatment comprises throttling precursor flow, not providing direct plasma RF power, not exposing the substrate to transformation treatment process gas, not providing halogen-containing gas and an ignition gas to the remote plasma source, and not providing RF power to the remote plasma source.

Figure 10:
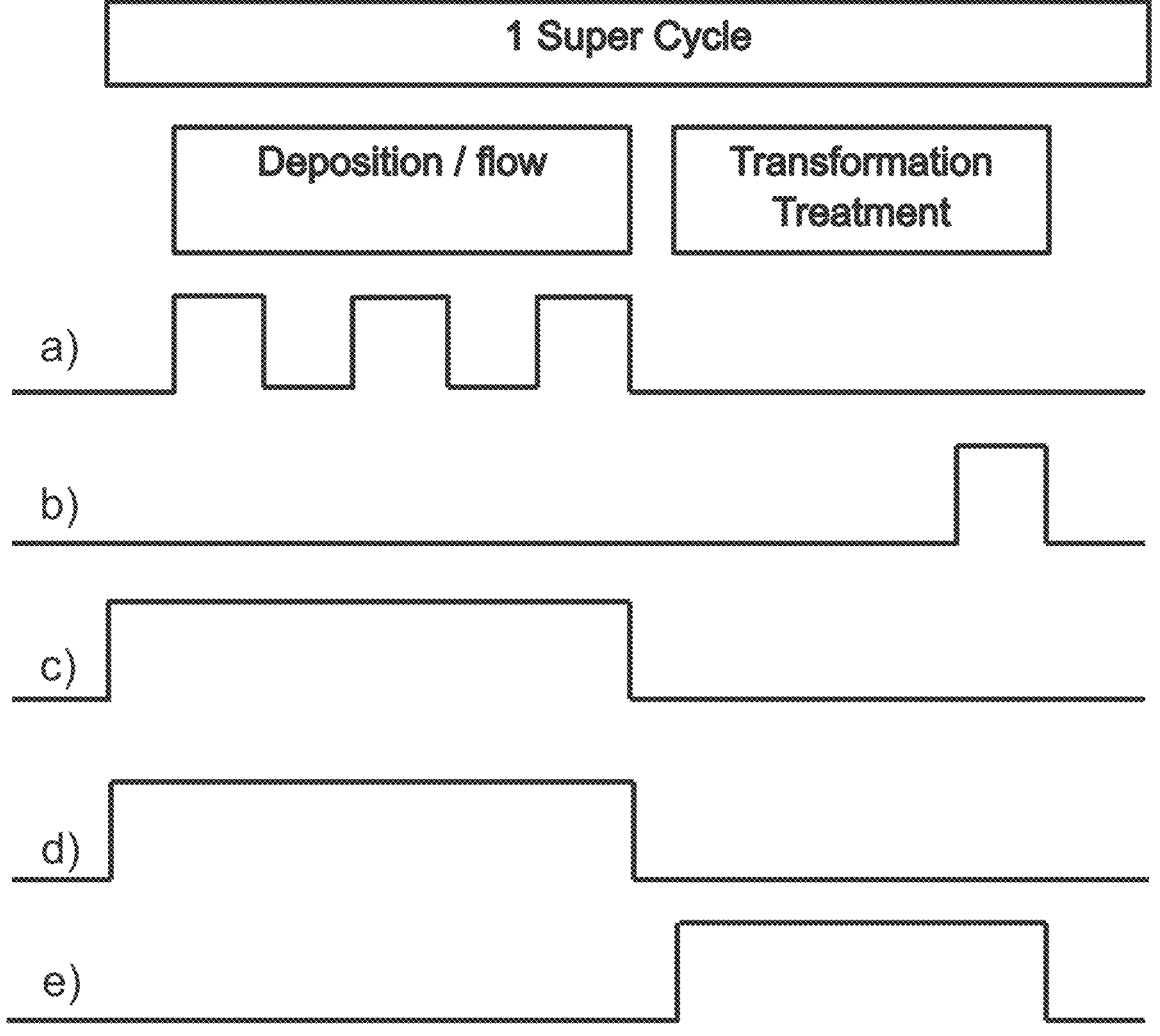
FIG. 10 shows another embodiment of a method as described herein.

FIG. 10 shows another embodiment of a method as described herein. The method of FIG. 10 is similar to that of FIG. 9, and only the differences are highlighted here.

As in FIG. 9, FIG. 10 line a) denotes precursor flow, FIG. 10, line b) denotes exposure of the substrate to a direct radio frequency (RF) plasma, line c) denotes providing a halogen-containing gas and an ignition gas to a remote plasma source, line d) denotes providing RF power to the remote plasma source, and line e) denotes exposing the substrate to transformation treatment process gas.

Whereas in the process of FIG. 9, precursor is flown continuously, the process of FIG. 10 features pulsed precursor flow. In other words, in a process according to FIG. 10, precursor can be provided intermittently. In some embodiments, precursor is provided in a plurality of micro pulses. The micropulses can be separated by micro purges. For example, one deposition step can comprise from at least 2 to at most $10^5$ micropulses, or from at least 5 to at most $10^4$ micropulses, or from at least 10 to at least $10^3$ micropulses, or from at least 20 to at most 100 micropulses. It shall be understood that, as in the process of FIG. 9, a process according to FIG. 10 can comprise providing precursor to a remote plasma source, or to a reaction space comprising the substrate, or both.

Figure 11:
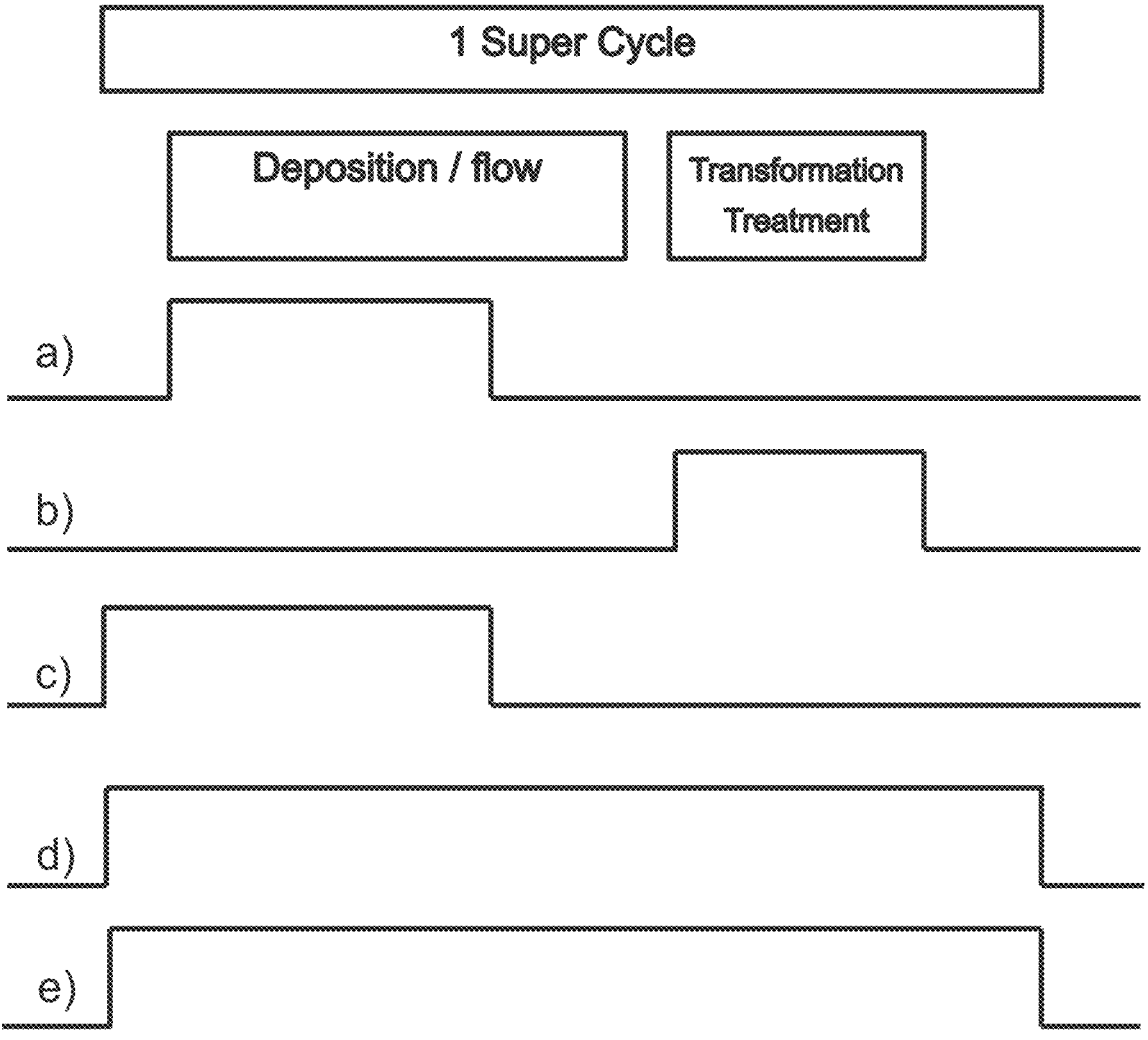
FIG. 11 shows another embodiment of a method as described herein.

FIG. 11 shows another embodiment of a method as described herein. In particular, FIG. 11 shows the time evolution of several parameters in an embodiment of a method as described herein. This embodiment is carried out in a system comprising a reaction chamber, a direct plasma source, and a remote plasma source. In particular, FIG. 11 shows a process comprising a super cycle.

FIG. 11, line a) denotes precursor flow. During at least a part of the deposition step, the substrate is exposed to precursor. During the transformation treatment, the substrate is not exposed to precursor. The precursor can be provided to a remote plasma source, or to a reaction space comprising the substrate, or both.

FIG. 11, line b) denotes exposure of the substrate to a direct radio frequency (RF) plasma. During the deposition step, the substrate is not exposed to a direct RF plasma. During at least a part of the transformation treatment, the substrate is exposed to a direct RF plasma.

FIG. 11, line c) denotes providing an ignition gas and a halogen-containing gas, if the precursor was not containing the halogen contained in the target flowable film, to a remote plasma source. During the transformation treatment, the flow of halogen-containing gas and ignition gas is stopped. In the embodiment shown, the halogen-containing gas and the ignition gas are provided to the remote plasma source even before the deposition step starts, which can improve process uniformity.

FIG. 11 line d) denotes providing RF power to the remote plasma source. RF power is continuously provided to the remote plasma source during the deposition step and during the transformation treatment. Hence, the remote plasma source is on during the deposition step and during the transformation treatment. In the embodiment shown, RF power is provided to the remote plasma source even before the deposition step starts.

Providing halogen-containing gas, ignition gas, and RF power to the remote plasma source before the deposition step starts, advantageously allows for obtaining a uniform and time-stable gas composition in the remote plasma source before precursor flow starts, and the actual deposition starts. Thus, process quality, uniformity, and repeatability can be improved.

FIG. 11 line e) denotes exposing the substrate to transformation treatment process gas. Suitable transformation treatment process gasses include noble gasses such as He and Ar, oxygen reactants such as $H_2O$ and $O_2$, nitrogen reactants such as $NH_3$, carbon reactants such as $CH_4$, and reducing agents such as $H_2$. In the embodiment shown, the substrate is continuously exposed to the transformation treatment process gas.

Optionally, DC or low frequency AC bias can be applied during the deposition step, the transformation treatment, or both to a suitable component comprised in the system such as a substrate support or a showerhead injector.

The process of FIG. 11 causes formation of a gap filling fluid in gaps comprised in the substrate during the deposition step. During the transformation treatment, the gap filling fluid is transformed, e.g. through densification, volatilization of some components, reduction, oxidation, nitrification, or carburization. In the embodiment of FIG. 11, the remote plasma source is in continuous and constant operation, and does not substantially interfere with the transformation treatment.

Figure 13:
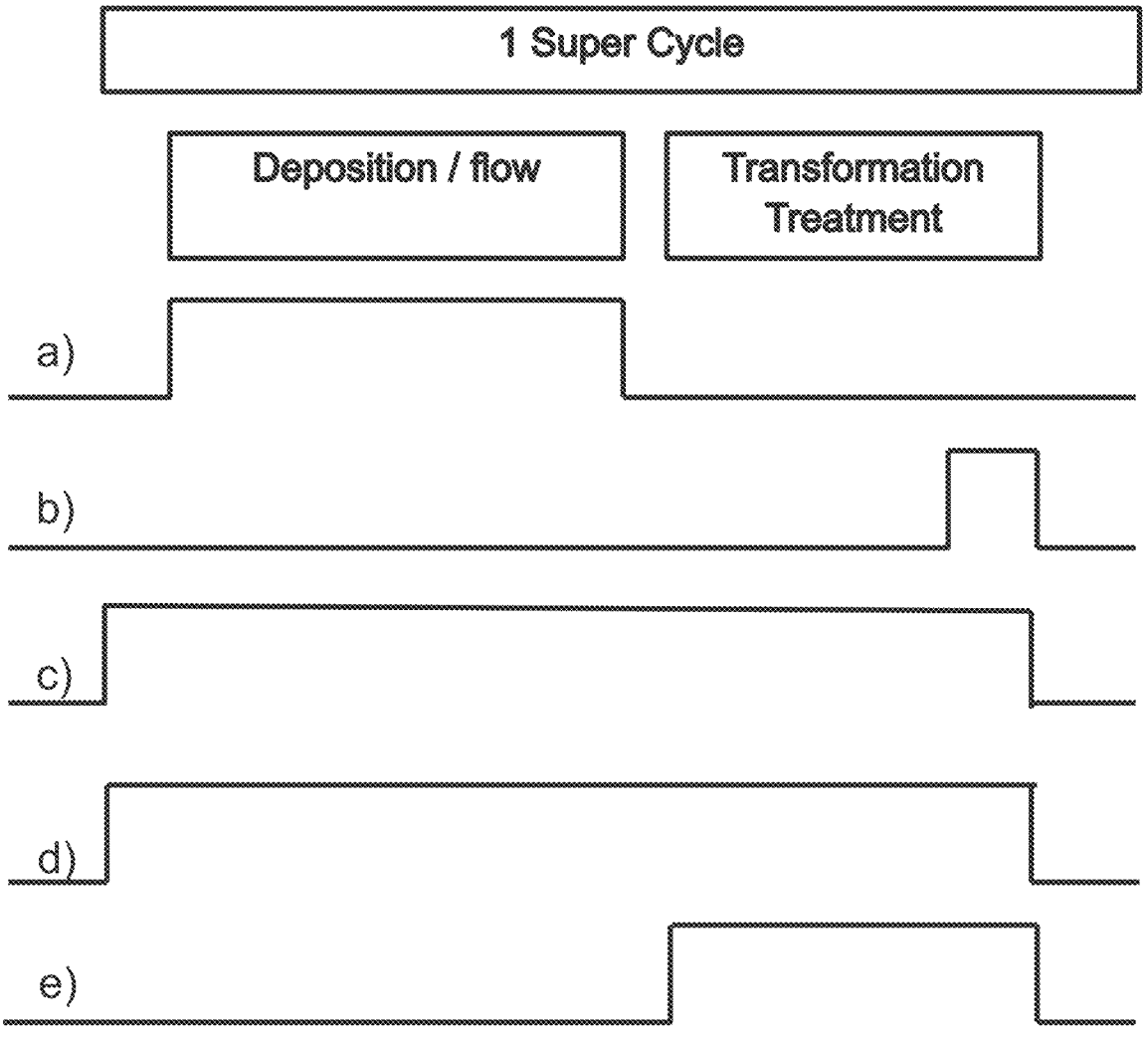
FIG. 13 shows another embodiment of a method as described herein.

FIG. 13 shows another embodiment of a method as described herein. In particular, FIG. 13 shows the time evolution of several parameters in an embodiment of a method as described herein. This embodiment is carried out in a system comprising a reaction chamber, a direct plasma source, and a remote plasma source. In particular, FIG. 11 shows a process comprising a super cycle.

FIG. 13, line a) denotes precursor flow. During at least a part of the deposition step, the substrate is exposed to a metal and halogen-containing precursor such as $TiF_4$. During the transformation treatment, the substrate is not exposed to precursor. The precursor can be suitably provided to a reaction space comprising the substrate.

FIG. 13, line b) denotes exposure of the substrate to a direct radio frequency (RF) plasma. During the deposition step, the substrate is not exposed to a direct RF plasma. During at least a part of the transformation treatment, the substrate is exposed to a direct RF plasma. The direct RF plasma can suitably employ a plasma gas comprising a noble gas such as argon. In some embodiments, argon is continuously provided to the reaction chamber. Alternatively, argon can be provided to the reaction chamber, e.g. only during the transformation treatment.

FIG. 13, line c) denotes providing an ignition gas such as Ar to a remote plasma source. The ignition gas is continuously provided to the remote plasma source. In the embodiment shown, the ignition gas is provided to the remote plasma source even before the deposition step starts, which can improve process uniformity.

FIG. 13 line d) denotes providing RF power to the remote plasma source. RF power is continuously provided to the remote plasma source during the deposition step and during the transformation treatment. Hence, the remote plasma source is on during the deposition step and during the transformation treatment. In the embodiment shown, RF power is provided to the remote plasma source even before the deposition step starts. Providing ignition gas and RF power to the remote plasma source before the deposition step starts, advantageously allows for obtaining a uniform and time-stable gas composition in the remote plasma source before precursor flow starts, and the actual deposition starts. Thus, process quality, uniformity, and repeatability can be improved.

FIG. 13 line e) denotes providing a transformation treatment process gas such as $O_2$ to the remote plasma source. Other suitable transformation treatment process gasses include noble gasses such as He and Ar, oxygen reactants such as $H_2O$, nitrogen reactants such as $NH_3$, carbon reactants such as $CH_4$, and reducing agents such as $H_2$. In the embodiment shown, the transformation treatment process gas is provided to the remote plasma source only during the transformation treatment.

Optionally, DC or low frequency AC bias can be applied during the deposition step, the transformation treatment, or both to a suitable component comprised in the system such as a substrate support or a showerhead injector.

The process of FIG. 13 causes formation of a gap filling fluid in gaps comprised in the substrate during the deposition step. During the transformation treatment, the gap filling fluid is transformed, e.g. through densification, volatilization of some components, reduction, oxidation, nitrification, or carburization. In the embodiment of FIG. 13, the remote plasma source is in continuous and constant operation.

Figure 14:
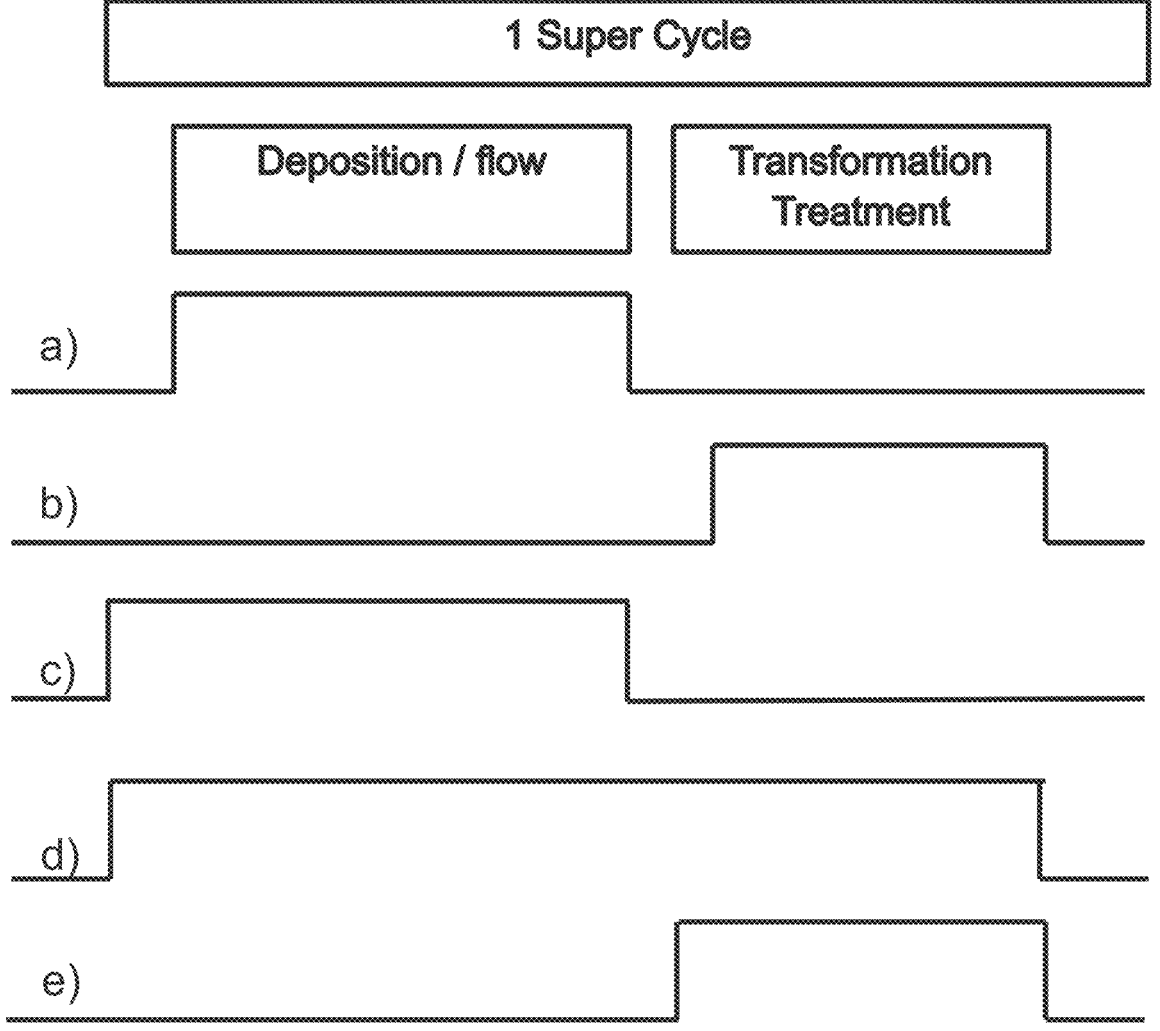
FIG. 14 shows another embodiment of a method as described herein.

FIG. 14 shows another embodiment of a method as described herein. In particular, FIG. 14 shows the time evolution of several parameters in an embodiment of a method as described herein. This embodiment is carried out in a system comprising a reaction chamber, a direct plasma source, and a remote plasma source. In particular, FIG. 11 shows a process comprising a super cycle.

FIG. 14, line a) denotes precursor flow. During at least a part of the deposition step, the substrate is exposed to a metal and halogen-containing precursor such as Tetrakis(ethylmethylamino)zirconium. During the transformation treatment, the substrate is not exposed to precursor. The precursor can be suitably provided to a reaction space comprising the substrate.

FIG. 14, line b) denotes exposure of the substrate to a direct radio frequency (RF) plasma. During the deposition step, the substrate is not exposed to a direct RF plasma. During at least a part of the transformation treatment, the substrate is exposed to a direct RF plasma.

FIG. 14, line c) denotes providing a halogen-containing gas such as $Cl_2$ to a remote plasma source during the deposition step. During the transformation treatment, the flow of halogen-containing gas is stopped. In the embodiment shown, the halogen-containing gas is provided to the remote plasma source even before the deposition step starts, which can improve process uniformity. It shall be understood that while the halogen-containing gas can be provided to the remote plasma source intermittently, a plasma ignition gas such as a noble gas such as Ar can be continuously provided to the remote plasma source throughout a super cycle, i.e. both during deposition step and during transformation treatment.

FIG. 14 line d) denotes providing RF power to the remote plasma source. RF power is continuously provided to the remote plasma source during the deposition step and during the transformation treatment. Hence, the remote plasma source is on during the deposition step and during the transformation treatment. In the embodiment shown, RF power is provided to the remote plasma source even before the deposition step starts.

Providing ignition gas and RF power to the remote plasma source before the deposition step starts, advantageously allows for obtaining a uniform and time-stable gas composition in the remote plasma source before precursor flow starts, and the actual deposition starts. Thus, process quality, uniformity, and repeatability can be improved.

FIG. 14 line e) denotes providing a transformation treatment process gas such as $O_2$ to the reaction chamber. Other suitable transformation treatment process gasses include noble gasses such as He and Ar, oxygen reactants such as $H_2O$, nitrogen reactants such as $NH_3$, carbon reactants such as $CH_4$, and reducing agents such as $H_2$. In the embodiment shown, the transformation treatment process gas is provided to the reaction chamber only during the transformation treatment, and not during the deposition step.

Optionally, DC or low frequency AC bias can be applied during the deposition step, the transformation treatment, or both to a suitable component comprised in the system such as a substrate support or a showerhead injector.

The process of FIG. 14 causes formation of a gap filling fluid in gaps comprised in the substrate during the deposition step. During the transformation treatment, the gap filling fluid is transformed, e.g. through densification, volatilization of some components, reduction, oxidation, nitrification, or carburization. In the embodiment of FIG. 14, the remote plasma source is in continuous and constant operation.

In some embodiments (not shown), a method as described herein method can comprise a plurality of super cycles, either one super cycle directly following a previous super cycle, or subsequent super cycles being separated by an inter super cycle purge. A super cycle comprises a deposition step, and a transformation treatment. The deposition step can alternatively be named a deposition/flow step. In some embodiments, the deposition step and the transformation treatment are executed directly after another. Alternatively, a purge can be executed between a deposition step and a transformation treatment, before a deposition step, and/or between a transformation treatment and a subsequent deposition step.

In some embodiments, a purge before a deposition step comprises stopping precursor flow, stopping direct plasma RF power, and stopping exposing the substrate to transformation treatment process gas. During at least part of the purge before a deposition step, halogen-containing gas and an ignition gas and RF power can be provided to the remote plasma source, thereby enhancing process stability.

In some embodiments, a purge between a deposition step and a transformation treatment comprises throttling precursor flow, not providing direct plasma RF power, not exposing the substrate to transformation treatment process gas, not providing halogen-containing gas and an ignition gas to the remote plasma source, and not providing RF power to the remote plasma source.

In some embodiments, a purge after a transformation treatment comprises throttling precursor flow, not providing direct plasma RF power, not exposing the substrate to transformation treatment process gas, providing halogen-containing gas and an ignition gas to the remote plasma source, and providing RF power to the remote plasma source.

Advantageously, continually providing halogen-containing gas and an ignition gas to the remote plasma source, and providing RF power to the remote plasma source throughout a plurality of super cycles, i.e. during both deposition/flow steps and transformation treatments, can advantageously result in process simplification and throughput gains.

Figure 12:
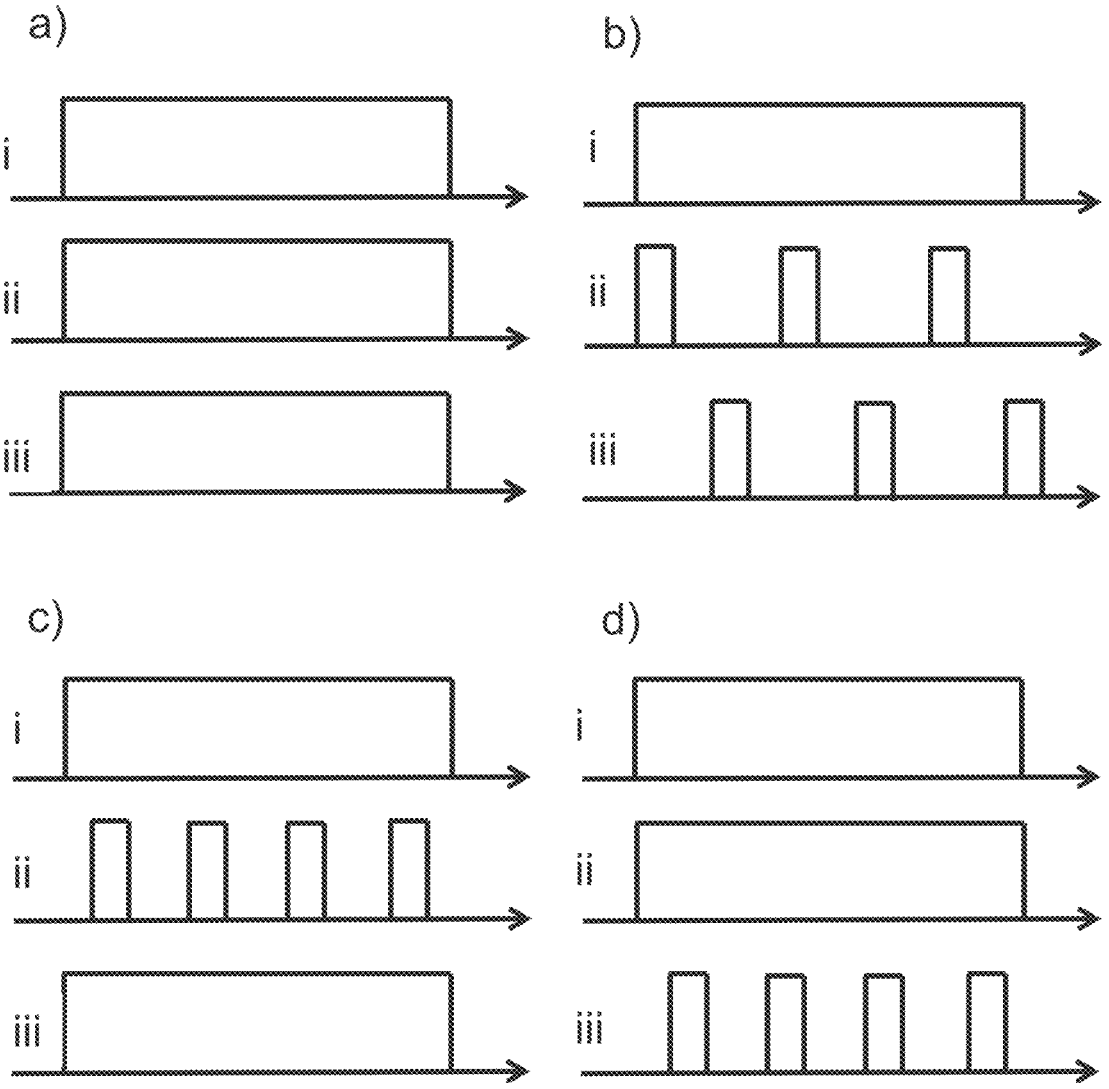
FIG. 12 shows exemplary pulsing schemes that can be used in an embodiment of a method as described herein.

FIG. 12, panels a), b), c), and d) show exemplary pulsing schemes that can be used in embodiments of methods as described herein, for example during formation of a gap filling fluid. In all panels of FIG. 12, line i denotes plasma gas flow, line ii denotes precursor flow, and line iii denotes plasma power. In panel a), plasma gas and precursor are continuously provided to the reaction chamber, and plasma power is continuously on during a deposition step. In panel b), plasma gas is continuously provided to the reaction chamber, precursor is provided intermittently, i.e. in pulses, to the reaction chamber, and plasma power provided intermittently, i.e. in plasma pulses, as well. In the embodiment shown, precursor pulses and plasma pulses do not overlap. In other words, the precursor pulses and the plasma pulses are separated by purges in which no precursor is provided to the reaction chamber, and in which no plasma is generated in the reaction chamber. In panel c), plasma gas is continuously provided to the reaction chamber, a plasma is continuously generated in the reaction chamber, and precursor is provided intermittently, i.e. in pulses, to the reaction chamber. In panel d), plasma gas is continuously provided to the reaction chamber, precursor is continuously provided to the reaction chamber, and plasma is generated intermittently, i.e. in pulses, in the reaction chamber.

It shall be understood that pulsing at least one of plasma power and precursor flow can, in some embodiments, improve throughput.

In a further exemplary embodiment, reference is made to a method for filling a gap with a germanium-containing substance. In particular, a gap comprised in a substrate is first filled with a flowable germanium fluoride ($GeF_x$) gap filling fluid. Optionally, the substrate can then be exposed to a transformation treatment. In this embodiment, a germanium precursor is used as precursor, and a fluorine-containing reactant is used. In some embodiments, plasma gas, precursor, and plasma power are continuously provided. Alternatively, at least one of precursor flow and plasma power may be pulsed. Exemplary modes of providing plasma gas, precursor, and plasma power are described in the context of FIG. 12.

Exemplary transformation treatments include oxidizing and nitridating transformation treatments that can be used to form a material in the gap that further comprises oxygen or nitrogen, such as germanium oxide germanium nitride.

Another exemplary transformation treatment includes exposure of the gap filling fluid to a silicon-containing gas, such as a silane-containing gas, such as $SiH_4$. Accordingly, a silicon and germanium-containing material can be formed in the gap. The SiGe containing material may be, in some embodiments, polycrystalline, amorphous, or partly amorphous and partly polycrystalline.

These transformation treatments can be employed in combination with any suitable embodiment of a method as described again, such as an embodiment comprising a PECVD, pulsed PECVD, or PEALD process. For example, an embodiment according to any one of FIGS. 9, 10, and 11. Suitable PECVD processes comprise continuously providing a precursor and reactant, and continuously generating plasma. Suitable pulsed PECVD processes comprise continuously providing at least one of a precursor, a reactant, and a continuously on plasma; while also providing at least one of precursor, reactant, and plasma power in a pulsed manner. Suitable PEALD processes can comprise providing a precursor in pulses, and generating a plasma in pulses. Precursor pulses and plasma pulses are separated by a purge. Reactant may either be continuously provided, or reactant may be provided in reactant pulses in which case reactant pulses may or may not be separated from at least one of plasma pulses and precursor pulses by means of a purge. It shall be understood that the term "PEALD" process as used herein refers to a cyclical process and may or may not refer to a process that employs partly or wholly self-limiting surface reactions.

In a further exemplary embodiment, reference is made to a method for filling a gap with a vanadium-substance. In particular, a gap comprised in a substrate is first filled with a vanadium and oxygen-containing gap filling fluid. Optionally, the substrate can then be exposed to a transformation treatment. In this embodiment, a vanadium and halogen-containing precursor is used as precursor, and an oxygen-containing reactant is used. In some embodiments, plasma gas, precursor, and plasma power are continuously provided. Alternatively, at least one of precursor flow and plasma power may be pulsed. Exemplary modes of providing plasma gas, precursor, and plasma power are described in the context of FIG. 12.

In some embodiments, the vanadium precursor comprises a vanadium halide, such as a vanadium chloride, such as $VCl_4$.

In some embodiments, the oxygen reactant is selected from $O_2$, $O_3$, $H_2O$, and $H_2O_2$. In some embodiments, the oxygen reactant comprises $O_2$ and $H_2$. In some embodiments, the oxygen reactant can be provided together with a noble gas such as He, Ne, Ar, Xe and Kr.

In some embodiments, the transformation treatment comprises exposing the substrate to a noble gas plasma such as a plasma in which the plasma gas comprises a noble gas selected from He, Ne, Ar, Xe, and Kr In some embodiments, the transformation treatment comprises exposing the substrate to a plasma in which the plasma gas contains an oxygen reactant such as $O_2$. Thus, a gap can be filled with a high quality vanadium and oxygen containing material.

In some embodiments, the transformation treatment comprises exposing the substrate to a plasma in which the plasma gas contains a nitrogen reactant such as $N_2$ or $NH_3$. In some embodiments, the plasma gas comprises $N_2$ and $H_2$. Optionally, the plasma gas further comprises a noble gas such as $H_2$, Ne, Ar, Kr, or Xe. Thus, a gap can be filled with a high quality vanadium and nitrogen containing material.

In some embodiments, the transformation treatment comprises exposing the substrate to a plasma in which the plasma gas substantially consists of a noble gas plasma. Thus, a gap can be filled with a high quality vanadium containing material.

In some embodiments, the transformation treatment comprises exposing the substrate to a plasma in which the plasma gas substantially consists of a noble gas and $H_2$. Thus, a gap can be filled with a high quality vanadium containing material.

In some embodiments, the transformation treatment is executed after all gap filling fluid has been formed. Alternatively, the transformation treatment can be executed cyclically. For example, in some embodiments, a method according to the present exemplary embodiment comprises a plurality of super cycles, each super cycle comprising a sub step of forming a vanadium-containing gap filling fluid, and a sub step of subjecting the substrate to a transformation treatment.

The invention claimed is:

1. A method of filling a gap, the method comprising:
providing a substrate to a reaction chamber, the substrate comprising the gap;
providing a precursor to the reaction chamber;
providing a reactant to the reaction chamber; and,
generating a plasma in the reaction chamber during at least one of providing the precursor to the reaction chamber and providing the reactant to the reaction chamber;
thereby allowing the precursor and the reactant to form a gap filling fluid; and,
thereby at least partially filling the gap with the gap filling fluid, the gap filling fluid comprising the metal or metalloid, wherein exposing the substrate to a precursor and to a reactant comprises one or more deposition cycles, a deposition cycle comprising a precursor pulse and a reactant pulse;
wherein the precursor pulse comprises providing precursor to the reaction chamber, and
wherein the reactant pulse comprises providing reactant to the reaction chamber,
wherein a deposition cycle further comprises a nitrogen reactant pulse, and wherein the nitrogen reactant pulse comprises providing a nitrogen reactant to at least one of the reaction chamber, the plasma generation space, or the remote plasma source,
wherein a deposition cycle comprises sequentially executing a plurality of subsequent precursor pulses and nitrogen reactant pulses before or after executing a reactant pulse, and
wherein the precursor comprises a metal halide and the reactant comprises an oxygen reactant.

2. The method according to claim 1 wherein the method comprises continuously providing the nitrogen reactant to the remote plasma source.

3. The method according to claim 1 wherein the plasma is continuously generated in the reaction chamber.

4. The method according to claim 1, wherein, while the gap filling fluid is formed, a conformal liner is simultaneously formed in the gap.

5. The method according to claim 1, wherein the oxygen reactant comprises at least one of $O_2$, $O_3$, or $H_2O$.

6. The method according to claim 1, wherein the nitrogen reactant comprises $N_2$, $NH_3$, or a gas mixture comprising $N_2$ and $H_2$.

7. The method according to claim 1 wherein the nitrogen reactant comprises a gas mixture comprising $N_2$ and $H_2$.

8. The method according claim 1, further comprising a step of exposing the substrate to a transformation treatment.

9. The method according to claim 8 comprising a plurality of super cycles, a super cycle comprising the step of providing a precursor, the step of providing a reactant, and the step of exposing the substrate to the transformation treatment.

10. The method according to claim 1, wherein the metal or metalloid comprises an element selected from W, Ge, Sb, Te, Nb, Ta, V, Hf, Ti, Zr, Rh, Fe, Cr, Mo, Au, Pt, Ag, Ni, Cu, Co, Zn, Al, In, Sn, and Bi.

11. A method of filling a gap, the method comprising:
providing a substrate to a reaction chamber, the substrate comprising the gap;
providing a precursor to the reaction chamber;
providing a reactant to at least one of a plasma generation space or a remote plasma source, wherein the plasma generation space is comprised in the reaction chamber, wherein the plasma generation space is separated from the substrate by means of a barrier, and wherein the remote plasma source is located outside of the reaction chamber; and,
generating a plasma in at least one of the plasma generation space or the remote plasma source while providing the reactant to at least one of the plasma generation space and the remote plasma source;
thereby allowing the precursor and the active species generated in at least one of the plasma generation space and the remote plasma source to form a gap filling fluid; and,
thereby at least partially filling the gap with the gap filling fluid, the gap filling fluid comprising the metal or metalloid, wherein providing the precursor to the reaction chamber and providing the reactant to at least one of a plasma generation space and a remote plasma source comprises one or more deposition cycles, a deposition cycle comprising a precursor pulse and a reactant pulse, wherein the precursor pulse comprises providing precursor to the reaction chamber, and wherein the reactant pulse comprises providing the reactant to at least one of the plasma generation space and the remote plasma source, wherein a deposition cycle further comprises a nitrogen reactant pulse, and wherein the nitrogen reactant pulse comprises providing a nitrogen reactant to at least one of the reaction chamber, the plasma generation space, and the remote plasma source, wherein a deposition cycle comprises sequentially executing a plurality of subsequent precursor pulses and nitrogen reactant pulses before or after executing a reactant pulse, and wherein the precursor comprises a metal halide and the reactant comprises an oxygen reactant.

12. The method according to claim 11 wherein the method comprises continuously providing the reactant to the remote plasma source.

13. The method according to claim 11 wherein the plasma is continuously generated in at least one of the plasma generation space and the remote plasma source.

14. A method of filling a gap, the method comprising:

providing a substrate, the substrate comprising the gap;

providing a system comprising a reaction chamber and a remote plasma source;

providing a precursor to the reaction chamber;

providing a reactant to the remote plasma source;

generating a plasma in the remote plasma source, thereby creating a plasma species in the remote plasma source; and, transporting the plasma species from the remote plasma source to the chamber;

thereby allowing the precursor and the reactant to form a gap filling fluid; and, thereby at least partially filling the gap with the gap filling fluid, the gap filling fluid comprising the metal or metalloid, wherein providing the precursor to the reaction chamber and transporting the plasma species comprises one or more deposition cycles, a deposition cycle comprising a precursor pulse and a species pulse, wherein the precursor comprises a metal halide and the reactant comprises an oxygen reactant, wherein the precursor pulse comprises providing precursor to the chamber, wherein the species pulse comprises providing species to the chamber, wherein a deposition cycle further comprises a nitrogen reactant pulse, and wherein a deposition cycle comprises sequentially executing a plurality of subsequent precursor pulses and nitrogen reactant pulses before or after executing a species pulse.

15. A method of filling a gap, the method comprising:

providing a substrate, the substrate comprising the gap;

providing a system comprising a first reaction chamber and a second reaction chamber;

providing a precursor to the first reaction chamber;

providing a reactant to the second reaction chamber;

generating a plasma in at least one of the first reaction chamber and the second reaction chamber;

executing a plurality of deposition cycles, a deposition cycle comprising moving the substrate to the first reaction chamber; and, moving the substrate to the second reaction chamber;

thereby allowing the precursor and the reactant to form a gap filling fluid; and, thereby at least partially filling the gap with the gap filling fluid, the gap filling fluid comprising the metal or metalloid, wherein the precursor comprises a metal halide and the reactant comprises an oxygen reactant, wherein the deposition cycle further comprises a nitrogen reactant pulse, wherein the deposition cycle comprises sequentially executing a plurality of subsequent moving the substrate to the first reaction chamber and nitrogen reactant pulses before or after moving the substrate to the second reaction chamber.

* * * * *